(12) United States Patent
Shimoshikiryoh et al.

(10) Patent No.: US 8,674,919 B2
(45) Date of Patent: Mar. 18, 2014

(54) LIQUID CRYSTAL DISPLAY WITH FIRST AND SECOND SUB-PICTURE ELEMENTS INCLUDING TWO STORAGE CAPACITORS

(75) Inventors: Fumikazu Shimoshikiryoh, Matsusaka (JP); Kentaroh Irie, Tsu (JP); Masanori Takeuchi, Tsu (JP); Nobuyoshi Nagashima, Matsusaka (JP); Toshihide Tsubata, Tsu (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/550,870

(22) Filed: Jul. 17, 2012

(65) Prior Publication Data

US 2012/0281168 A1 Nov. 8, 2012

Related U.S. Application Data

(62) Division of application No. 12/376,373, filed as application No. PCT/JP2007/065635 on Aug. 9, 2007, now abandoned.

(30) Foreign Application Priority Data

Aug. 10, 2006 (JP) .................................. 2006-218926
Mar. 9, 2007 (JP) .................................. 2007-060426

(51) Int. Cl.
 *G09G 3/36* (2006.01)
 *G02F 1/1343* (2006.01)
(52) U.S. Cl.
 USPC ................... 345/92; 345/93; 345/98; 349/39; 349/144
(58) Field of Classification Search
 USPC .................. 345/87–100, 204, 690, 694–695; 349/38–39, 144
 See application file for complete search history.

(56) References Cited

U.S. PATENT DOCUMENTS

| | | | |
|---|---|---|---|
| 5,798,745 A | * | 8/1998 | Steffensmeier ................. 345/92 |
| 6,724,452 B1 | | 4/2004 | Takeda et al. |
| 6,909,415 B2 | * | 6/2005 | Kumagawa et al. ............ 345/92 |
| 6,958,791 B2 | | 10/2005 | Shimoshikiryo |
| 7,113,233 B2 | | 9/2006 | Lyu |

(Continued)

FOREIGN PATENT DOCUMENTS

| | | |
|---|---|---|
| EP | 1 674 922 A1 | 6/2006 |
| JP | 2003-270614 | 9/2003 |

OTHER PUBLICATIONS

U.S. Appl. No. 12/376,373, filed Feb. 4, 2009; Shimoshikiryoh et al.

(Continued)

*Primary Examiner* — Bipin Shalwala
*Assistant Examiner* — Keith Crawley
(74) *Attorney, Agent, or Firm* — Nixon & Vanderhye, P.C.

(57) ABSTRACT

Each picture element includes first and second sub-picture elements, each of which includes a liquid crystal capacitor and at least one storage capacitor. After a display voltage representing a certain grayscale level has been applied to the respective sub-picture element electrodes of the first and second sub-picture elements, a voltage difference $\Delta V\alpha$ is produced between voltages to be applied to the respective liquid crystal capacitors of the first and second sub-picture elements by way of their associated storage capacitor(s). By setting the voltage difference $\Delta V\alpha$ value of the blue and/or cyan picture element(s) to be smaller than that of the other color picture elements, shift toward the yellow range at an oblique viewing angle can be minimized.

6 Claims, 16 Drawing Sheets

(56) References Cited

U.S. PATENT DOCUMENTS

| | | | |
|---|---|---|---|
| 2003/0227429 A1 | 12/2003 | Shimoshikiryo | |
| 2004/0001167 A1 | 1/2004 | Takeuchi et al. | |
| 2005/0122441 A1* | 6/2005 | Shimoshikiryoh | 349/38 |
| 2006/0028589 A1* | 2/2006 | Um et al. | 349/33 |
| 2006/0208984 A1 | 9/2006 | Kim et al. | |
| 2006/0250533 A1* | 11/2006 | Shih | 349/38 |
| 2006/0284811 A1* | 12/2006 | Huang | 345/92 |
| 2007/0242009 A1* | 10/2007 | Su | 345/87 |

OTHER PUBLICATIONS

International Search Report for PCT/JP2007/065635, mailed Oct. 9, 2007.

English translation of the International Preliminary Report on Patentability mailed Feb. 19, 2009 in corresponding PCT Application No. PCT/JP2007/065635.

Supplementary EP Search Report mailed Aug. 24, 2010 in corresponding EP Application No. 07792285.4.

* cited by examiner

FIG.1
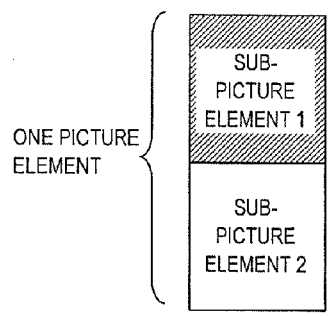
FIG.2
(a)
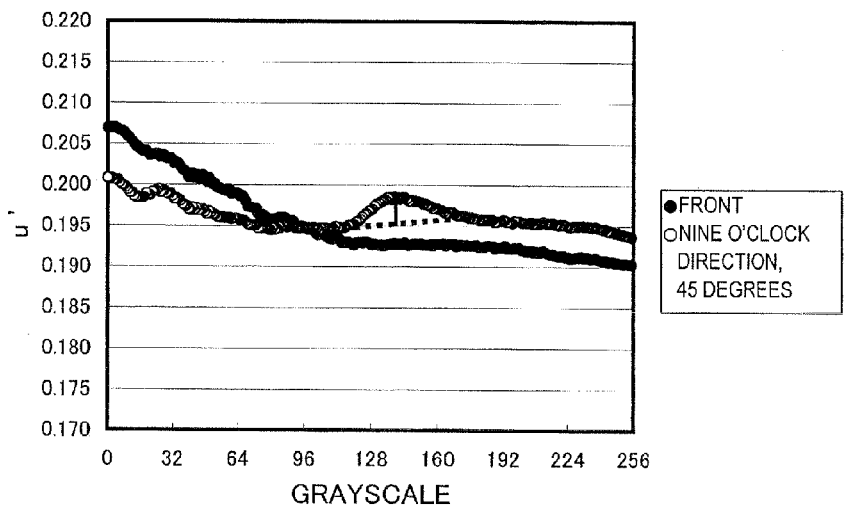
(b)
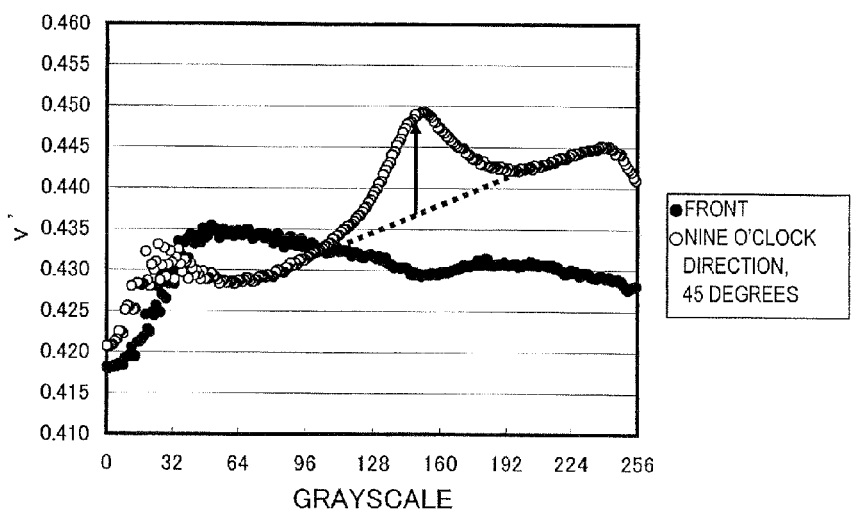

FIG.3
(a)
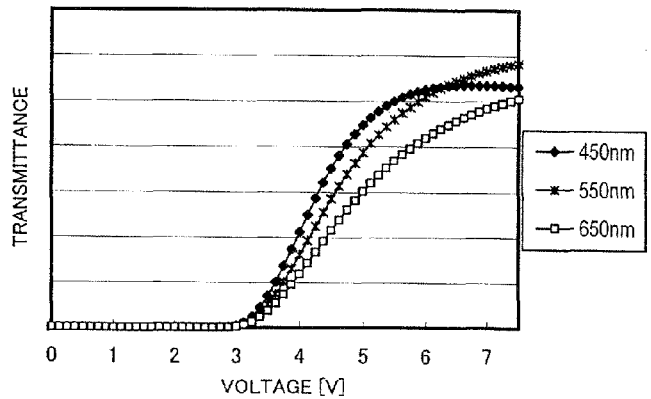
(b)
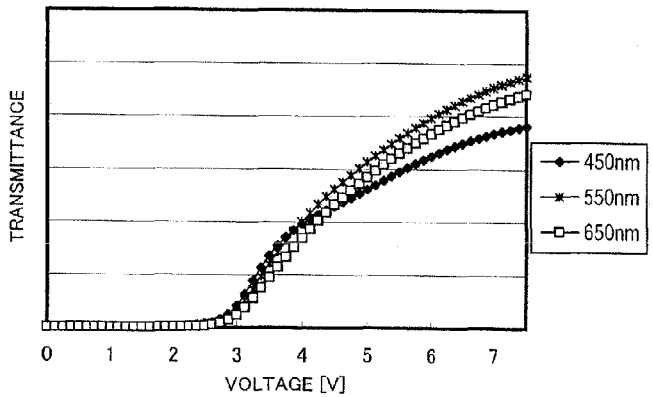
FIG.4
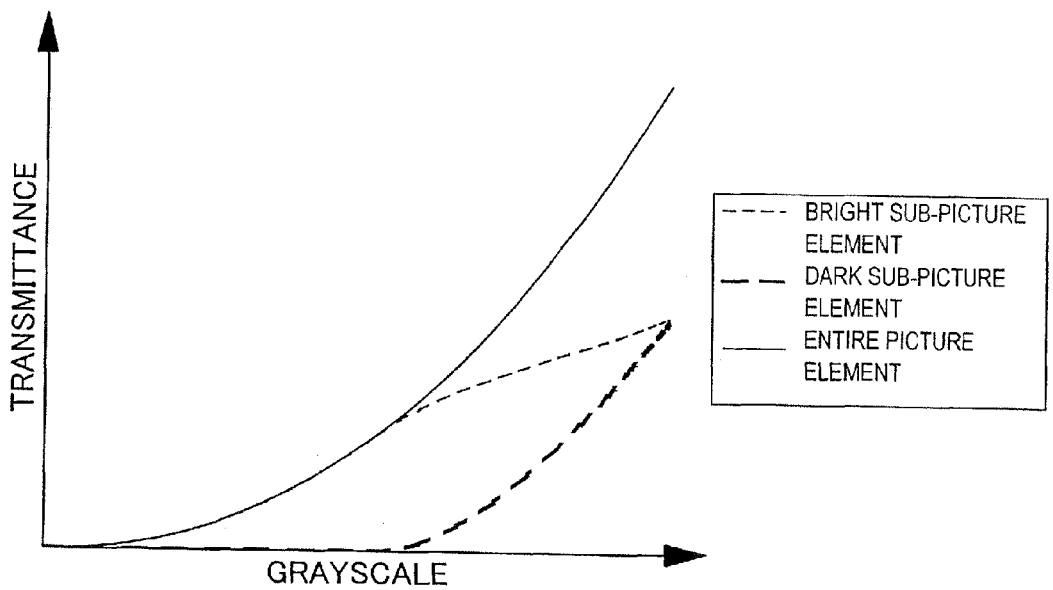

LIQUID CRYSTAL DISPLAY WITH FIRST AND SECOND SUB-PICTURE ELEMENTS INCLUDING TWO STORAGE CAPACITORS

This application is a division of U.S. patent application Ser. No. 12/376,373 filed Feb. 4, 2009 now abandoned, which is the U.S. national phase of International Application No. PCT/JP2007/065635, filed 9 Aug. 2007, which designated the U.S. and claims priority to Japanese Patent Application Nos. 2006-218926, filed 10 Aug. 2006, and 2007-060426, filed 9 Mar. 2007, the entire contents of all of which are hereby all incorporated herein by reference.

TECHNICAL FIELD

The present invention relates to a liquid crystal display device and more particularly relates to a liquid crystal display device with an excellent viewing angle characteristic.

BACKGROUND ART

Recently, liquid crystal displays (LCDs) have become immensely popular as a big monitor screen for a TV receiver (which will be simply referred to herein as a "TV").

Those LCDs for use as a big monitor screen for a TV include a so-called "VA mode LCD" that uses a vertical alignment liquid crystal layer (see Patent Document No. 1, for example).

A conventional VA mode LCD has different gamma curves, representing a grayscale-luminance characteristic, when viewed from a frontal viewing angle (i.e., when viewed along a normal to the monitor screen) and when viewed from an oblique viewing angle (i.e., when the polar angle is greater than zero degrees). And as the transmittance at an oblique viewing angle becomes higher than at the frontal viewing angle, the image may look whitish or excessively bright (which is sometimes called a "whitening phenomenon") at the oblique viewing angle. A "multi-picture element" technique is one of various means for suppressing such a whitening phenomenon at an oblique viewing angle. According to the multi-picture element technique, one picture element is divided into two or more sub-picture elements that have mutually different luminances and a grayscale is represented by those two or more sub-picture elements. The multi-picture element technique is also called a "picture element division" technique or an "area grayscale" technique. The multi-picture element technique is disclosed in Patent Documents Nos. 2 and 3, for example, the entire disclosure of which are hereby incorporated by reference.

Patent Document No. 1: Japanese Patent Application Laid-Open Publication No. 11-242225
Patent Document No. 2: Japanese Patent Application Laid-Open Publication No. 2004-062146 (corresponding to U.S. Pat. No. 6,958,791)
Patent Document No. 3: Japanese Patent Application Laid-Open Publication No. 2005-55896
Patent Document No. 4: Japanese Patent Application Laid-Open Publication No. 2003-270614

DISCLOSURE OF INVENTION

Problems to be Solved by the Invention

However, the present inventors discovered via experiments that the LCDs having the multi-picture element structures disclosed in Patent Documents Nos. 2 and 3 have the following problems.

Specifically, when the present inventors fabricated a sample LCD with the multi-picture element structure and analyzed its viewing angle characteristic in detail, the color balance was lost and shifted toward the yellow range at around an intermediate grayscale (e.g., around 145/255 grayscale) at an oblique viewing angle. This is a problem that occurs to various degrees not just in the VA mode but also in any other display mode as well.

Meanwhile, according to the multi-picture element technique disclosed in Patent Document No. 3, the liquid crystal capacitors Clca and Clcb of a sub-picture element are capacitively coupled together with a coupling capacitance Ccp as show in FIG. 5 of Patent Document No. 3. However, the magnitude of the coupling capacitance Ccp is affected by some variation that inevitably occurs during the manufacturing process. That is to say, even if varied on a color-by-color basis, the magnitude of the coupling capacitance Ccp is still affected by a variation occurring during the manufacturing process. Consequently, it is difficult to fabricate an LCD with a good color balance at a high production yield.

It should be noted that Patent Document No. 4 discloses a method for controlling a backlight and a method for performing signal processing and correction in response to an input video signal in order to compensate for the loss of the white balance when an iodine polarizer is used. However, Patent Document No. 4 neither discloses nor suggests the problems mentioned above.

In order to overcome the problems described above, the present invention has an object of providing, first and foremost, a liquid crystal display device that can minimize such a loss of the color balance at an oblique viewing angle and that can be manufactured at a high production yield.

Means for Solving the Problems

A liquid crystal display device according to the present invention includes a plurality of picture elements that are arranged in columns and rows so as to form a matrix pattern. Each of those picture elements includes a liquid crystal layer and a plurality of electrodes for applying a voltage to the liquid crystal layer. Each of those picture elements includes a first sub-picture element and a second sub-picture element having the ability to apply mutually different voltages to their liquid crystal layer. At a grayscale level, the first sub-picture element has a higher luminance than the second sub-picture element. Each of the first and second sub-picture elements includes: a liquid crystal capacitor formed by a counter electrode and a sub-picture element electrode that faces the counter electrode through the liquid crystal layer; and at least one storage capacitor, each being formed by a storage capacitor electrode that is electrically connected to the sub-picture element electrode, an insulating layer, and a storage capacitor counter electrode that is opposed to the storage capacitor electrode with the insulating layer interposed between them. After a display voltage representing a certain grayscale level has been applied to the respective sub-picture element electrodes of the first and second sub-picture elements, a voltage difference $\Delta V\alpha$ is produced between voltages to be applied to the respective liquid crystal capacitors of the first and second sub-picture elements by way of their associated storage capacitor(s). In some of the picture elements, the voltage difference $\Delta V\alpha$ changes from one picture element to another.

In one preferred embodiment, the picture elements include a plurality of color picture elements that represent mutually different colors and that include a blue picture element and/or a cyan picture element. Among those color picture elements, the ΔVα value of the blue and/or cyan picture element(s) is the smallest.

In another preferred embodiment, the at least one storage capacitor includes only one storage capacitor. The counter electrode is a single electrode that is provided in common for the first and second sub-picture elements. The storage capacitor counter electrodes of the first and second sub-picture elements are electrically independent of each other. And the waveforms of storage capacitor counter voltages to be supplied through storage capacitor lines that are associated with the storage capacitor counter electrodes are different between the first and second sub-picture elements. In some of the picture elements, the storage capacitors have different capacitance values. As used herein, if "the storage capacitors of a picture element have different capacitance values", then it means that at least one of the storage capacitors of the first and second sub-picture elements has a different storage capacitance value from the other(s). Normally, the capacitance values of two or more storage capacitors in a single picture element are defined to be equal to each other.

In this particular preferred embodiment, the picture elements include a plurality of color picture elements that represent mutually different colors and that include a blue picture element and/or a cyan picture element. Among those color picture elements, the capacitance value of the storage capacitor of the blue and/or cyan picture element(s) is the smallest.

In a specific preferred embodiment, the color picture elements further include a red picture element and a green picture element. Supposing the capacitance values of the storage capacitors of the blue and/or cyan picture element(s), the green picture element, and the red picture element are identified by $C_{CS-B}$, $C_{CS-C}$, $C_{CS-G}$ and $C_{CS-R}$, respectively, the inequality $C_{CS-B} \leq C_{CS-C} < C_{CS-G} \leq C_{CS-R}$ is satisfied.

In another preferred embodiment, the at least one storage capacitor includes only one storage capacitor. The counter electrode is a single electrode that is provided in common for the first and second sub-picture elements. The storage capacitor counter electrodes of the first and second sub-picture elements are electrically independent of each other. And the waveforms of storage capacitor counter voltages to be supplied through storage capacitor lines that are associated with the storage capacitor counter electrodes are different between the first and second sub-picture elements. In some of the picture elements, the liquid crystal capacitors have different capacitance values.

In still another preferred embodiment, the liquid crystal display device further includes gate bus lines, source bus lines and TFTs. Each of the first and second sub-picture elements includes a TFT that is connected to the sub-picture element electrode thereof. One of the picture elements that has the smallest voltage difference ΔVα further includes a storage capacitor that has been formed between the picture element's row and the gate bus line of its adjacent row.

In yet another preferred embodiment, the liquid crystal display device further includes gate bus lines, source bus lines and TFTs. Each of the first and second sub-picture elements includes a TFT that is connected to the sub-picture element electrode thereof. The gate-drain capacitance Cgd of the TFT of one of the picture elements that has the smallest voltage difference ΔVα is smaller than that of the TFT of any other picture element.

In yet another preferred embodiment, the liquid crystal layer is a vertical alignment liquid crystal layer and contributes to conducting a display operation in normally black mode.

In yet another preferred embodiment, the at least one storage capacitor includes two storage capacitors. The counter electrode is a single electrode that is provided in common for the first and second sub-picture elements. The storage capacitor counter electrodes of the two storage capacitors of the first sub-picture element are electrically independent of each other. And the storage capacitor counter electrodes of the two storage capacitors of the second sub-picture element are also electrically independent of each other.

In this particular preferred embodiment, if the two storage capacitors of the first sub-picture element are identified by CS1A and CS1B and if the two storage capacitors of the second sub-picture element are identified by CS2A and CS2B, the storage capacitor counter electrodes of the storage capacitors CS1A and CS2B are electrically connected to the same first storage capacitor line. The storage capacitor counter electrodes of the storage capacitors CS1B and CS2A are electrically connected to the same second storage capacitor line. And the first and second storage capacitor lines are electrically independent of each other.

In a specific preferred embodiment, if the capacitance values of the storage capacitors CS1A, CS1B, CS2A and CS2B are identified by Ccs1A, Ccs1B, Ccs2A and Ccs2B, respectively, and if Ccs1α=Ccs1A−Ccs1B and Ccs2α=Ccs2A−Ccs2B, some of the picture elements have different Ccs1α or Ccs2α.

In a more specific preferred embodiment, the picture elements include a plurality of color picture elements that represent mutually different colors and that include a blue picture element and/or a cyan picture element. Among those color picture elements, the Ccs1α and Ccs2α values of the blue and/or cyan picture element(s) are the smallest.

In another preferred embodiment, if Ccs1β=Ccs1A+Ccs1B and Ccs2β=Ccs2A+Ccs2B, the Ccs1β and Ccs2β values remain the same in every picture element.

Another liquid crystal display device according to the present invention includes a plurality of picture elements that are arranged in columns and rows so as to form a matrix pattern. Each of those picture elements includes a liquid crystal layer and a plurality of electrodes for applying a voltage to the liquid crystal layer. Each of those picture elements includes a first sub-picture element and a second sub-picture element having the ability to apply mutually different voltages to their liquid crystal layer. At a grayscale level, the first sub-picture element has a higher luminance than the second sub-picture element. Each of the first and second sub-picture elements includes: a liquid crystal capacitor formed by a counter electrode and a sub-picture element electrode that faces the counter electrode through the liquid crystal layer; and at least two storage capacitors, each being formed by a storage capacitor electrode that is electrically connected to the sub-picture element electrode, an insulating layer, and a storage capacitor counter electrode that is opposed to the storage capacitor electrode with the insulating layer interposed between them. The counter electrode is a single electrode that is provided in common for the first and second sub-picture elements. The storage capacitor counter electrodes of the at least two storage capacitors of the first sub-picture element are electrically independent of each other. And the storage capacitor counter electrodes of the at least two storage capacitors of the second sub-picture element are also electrically independent of each other.

In one preferred embodiment, if two storage capacitors of the first sub-picture element are identified by CS1A and CS1B and if two storage capacitors of the second sub-picture element are identified by CS2A and CS2B, the storage capacitor counter electrodes of the storage capacitors CS1A and CS2B are electrically connected to the same first storage capacitor line. The storage capacitor counter electrodes of the storage capacitors CS1B and CS2A are electrically connected to the same second storage capacitor line. And the first and second storage capacitor lines are electrically independent of each other.

Effects of the Invention

The present invention provides a liquid crystal display device that can minimize such a loss of the color balance (particularly, a shift toward the yellow range) at an oblique viewing angle and that can be manufactured at a high production yield. The present invention also provides a liquid crystal display device with a novel structure that contributes greatly to achieving such an object.

BRIEF DESCRIPTION OF DRAWINGS

FIG. 1 is a schematic representation illustrating an exemplary multi-picture element structure.

FIGS. 2(*a*) and 2(*b*) show how the chromaticity changes with the viewing angle in a liquid crystal display device having the multi-picture element structure shown in FIG. 1. Specifically, FIGS. 2(*a*) and 2(*b*) are graphs showing the chromaticity variations in u' and v' chromaticity coordinates with the grayscales at a frontal viewing angle and at an oblique viewing angle (of which the orientation was nine o'clock direction and the polar angle was 45 degrees).

FIGS. 3(*a*) and 3(*b*) are graphs showing how the transmittances with respect to incoming color light rays in blue, green and red with wavelengths of 450 nm, 550 nm and 650 nm, respectively, changed with the voltage applied to the liquid crystal layer of a VA mode LCD. Specifically, FIGS. 3(*a*) and 3(*b*) are graphs showing the voltage-transmittance characteristics at the frontal viewing angle and at an oblique viewing angle (of which the orientation was nine o'clock direction and the polar angle was 45 degrees), respectively.

FIG. 4 shows the grayscale-transmittance characteristics of a liquid crystal display device with the multi-picture element structure at the frontal viewing angle.

Figure 8:
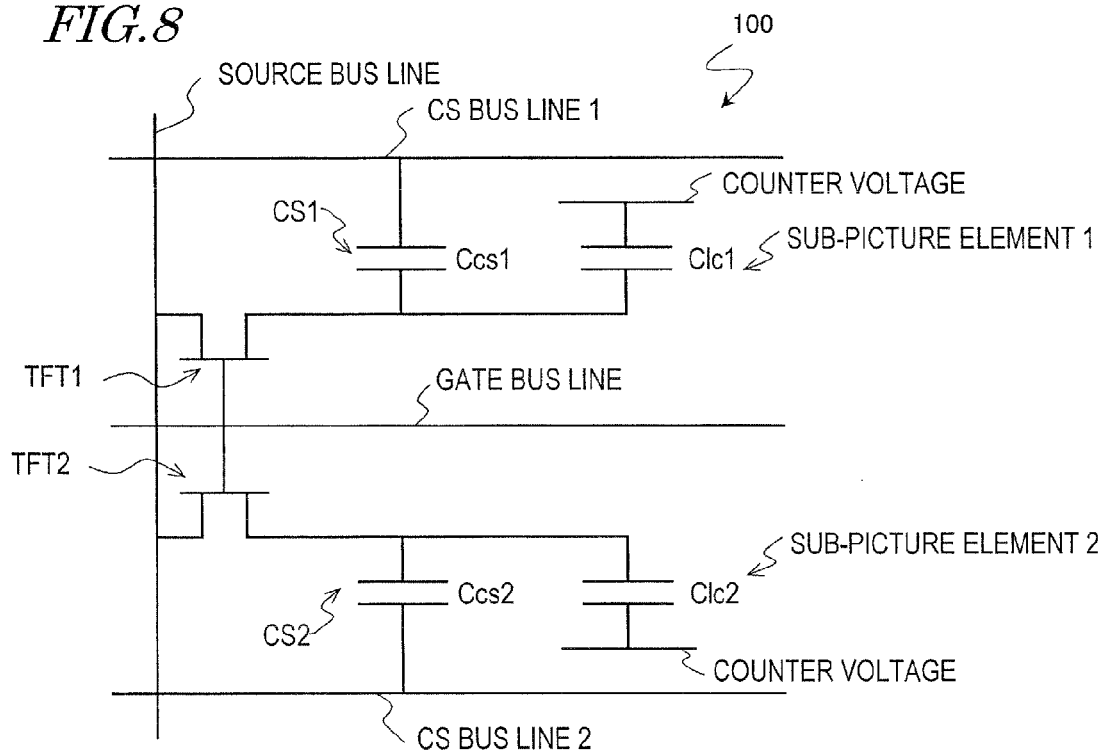
FIG. 8 is an equivalent circuit diagram of a picture element with the multi-picture element structure.
Figure 9:
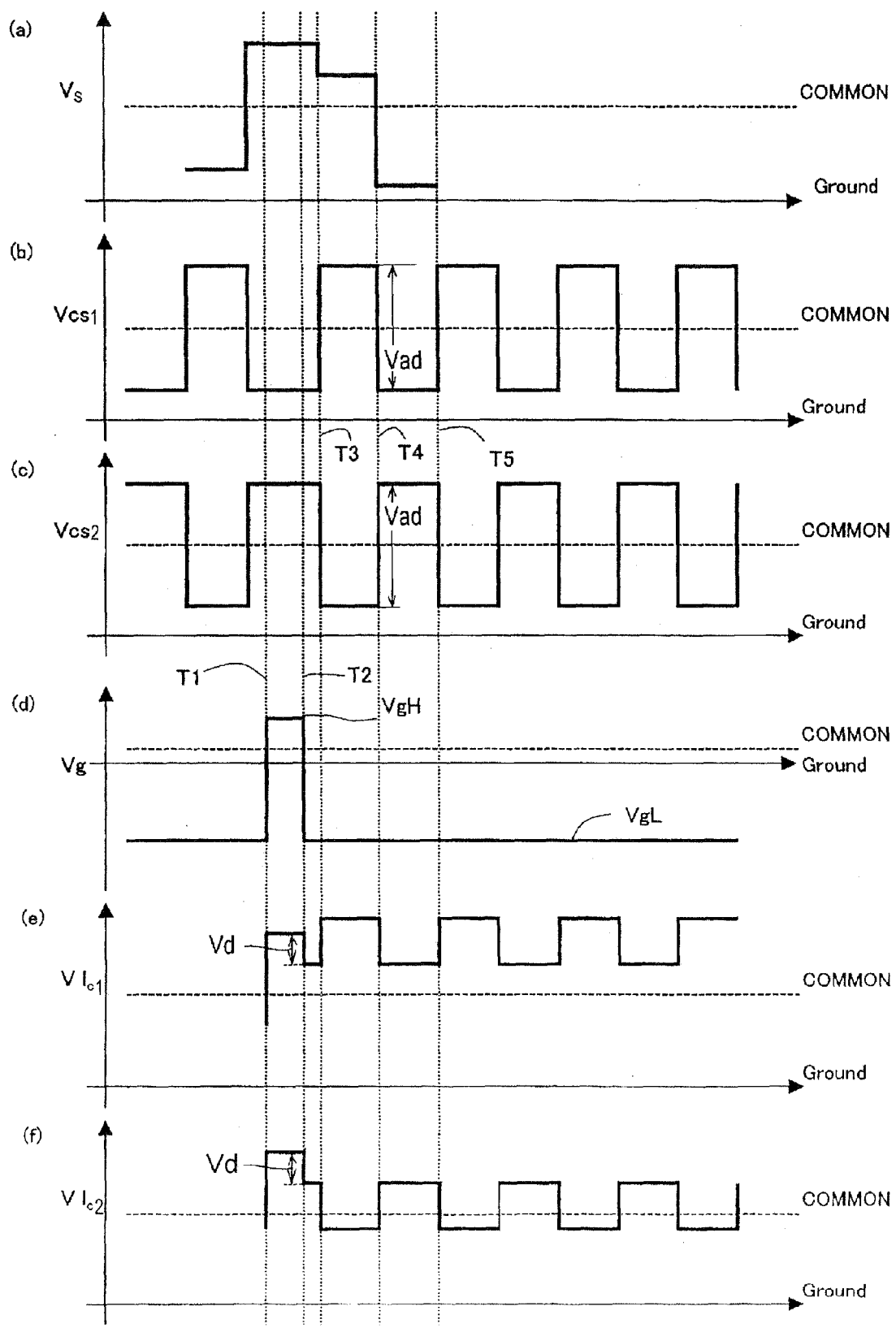

Portions (a) through (f) of FIG. 9 schematically show the waveforms of voltages to be applied and timings to drive a liquid crystal display device with the multi-picture element structure shown in FIG. 8.

Figure 10:
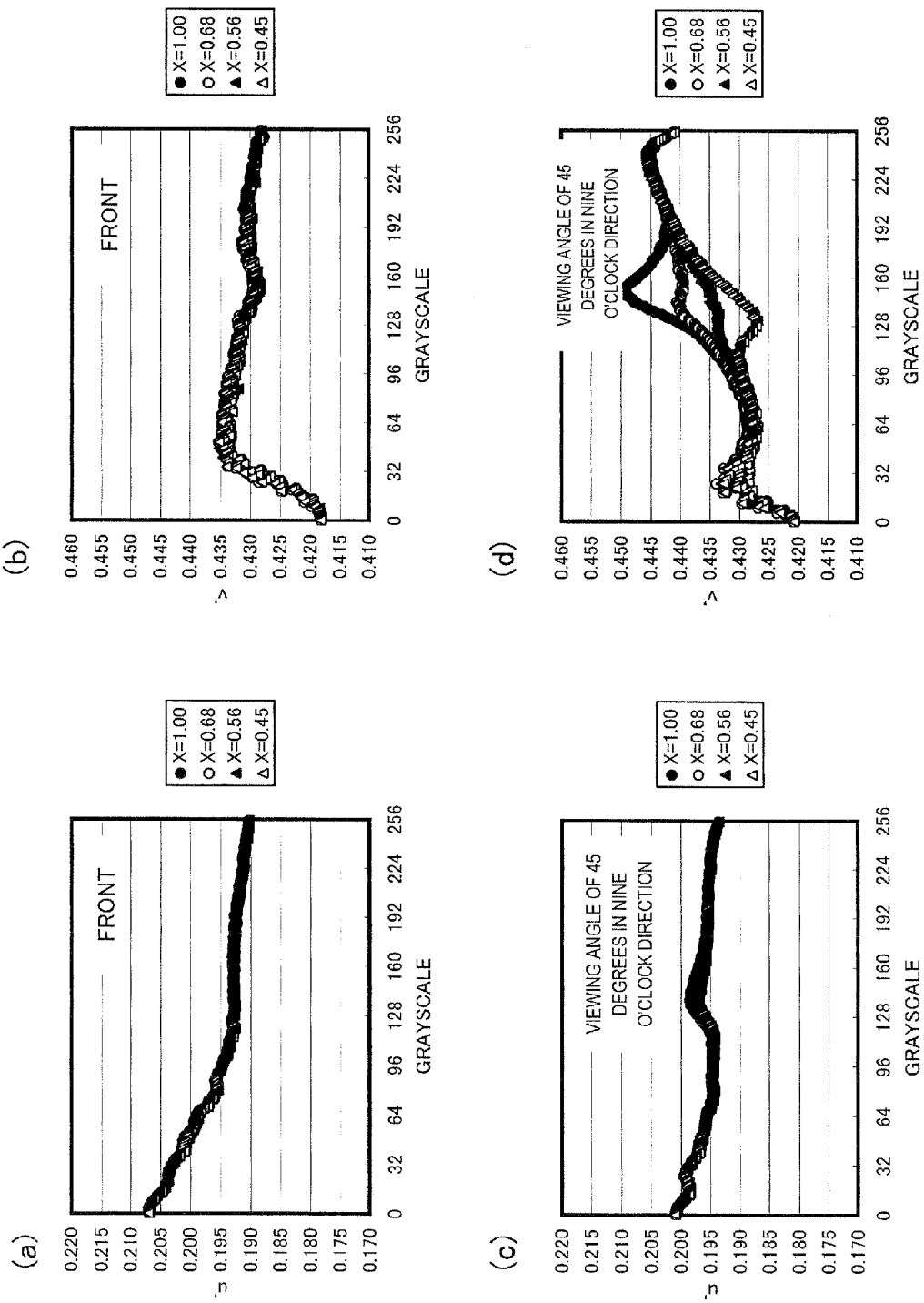

FIG. 10 shows graphs showing the chromaticity variations in u' and v' chromaticity coordinates with the grayscales at a frontal viewing angle and at an oblique viewing angle (of which the orientation was nine o'clock direction and the polar angle was 45 degrees) in a liquid crystal display device as a preferred embodiment of the present invention.

Figure 11:
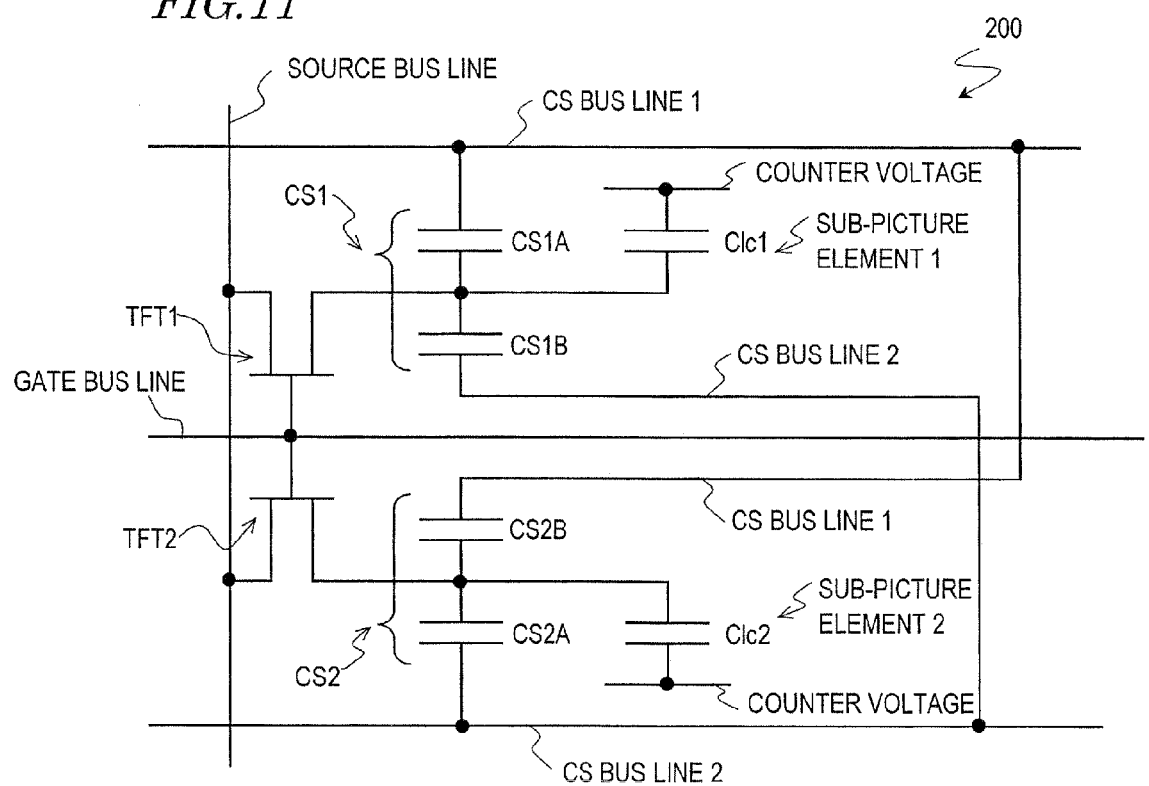

FIG. 11 is an equivalent circuit diagram of a picture element with another multi-picture element structure.

Figure 12:
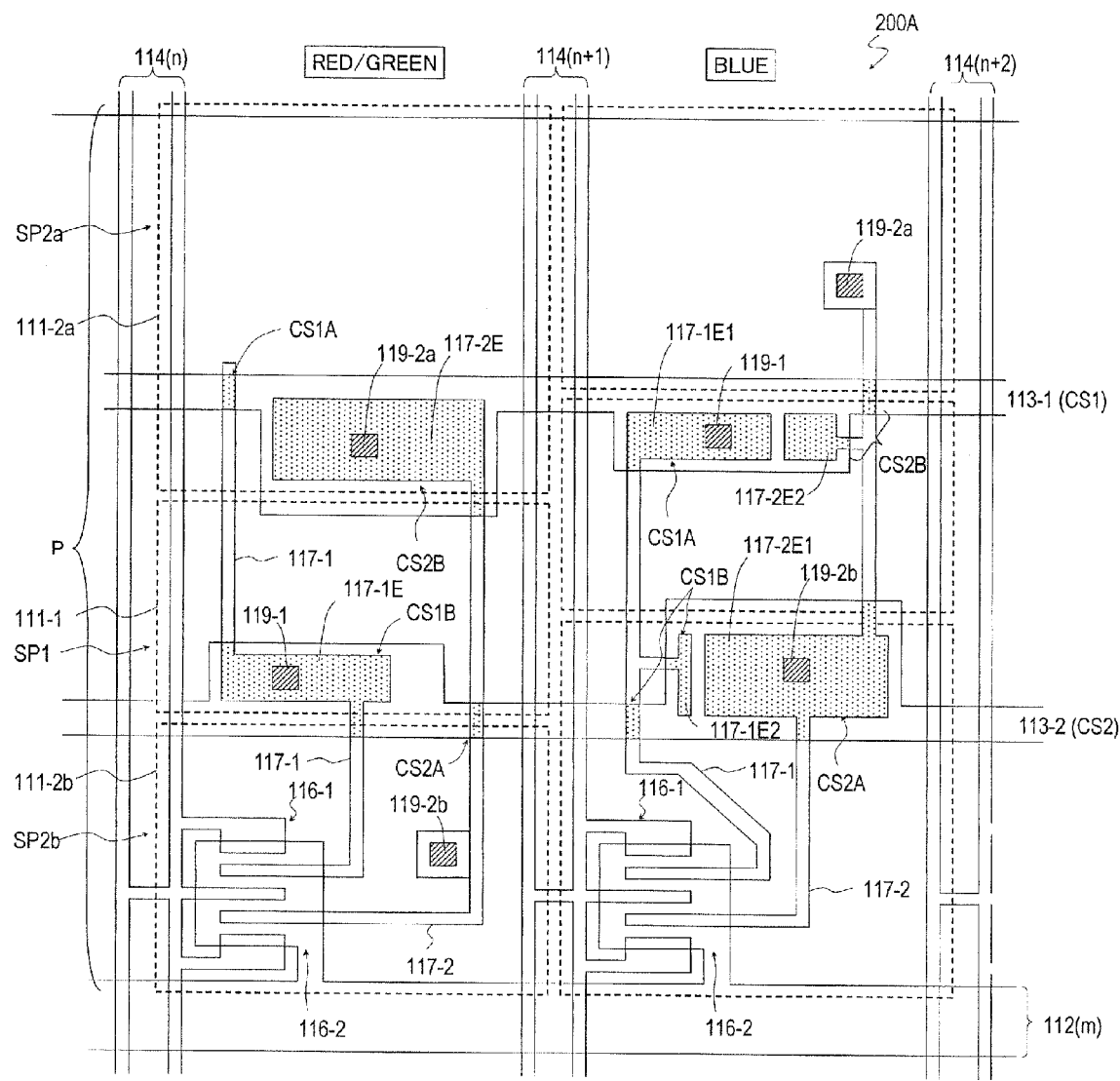

FIG. 12 is a schematic representation illustrating the picture element structure of a liquid crystal display device 200A as another preferred embodiment of the present invention.

Figure 13:
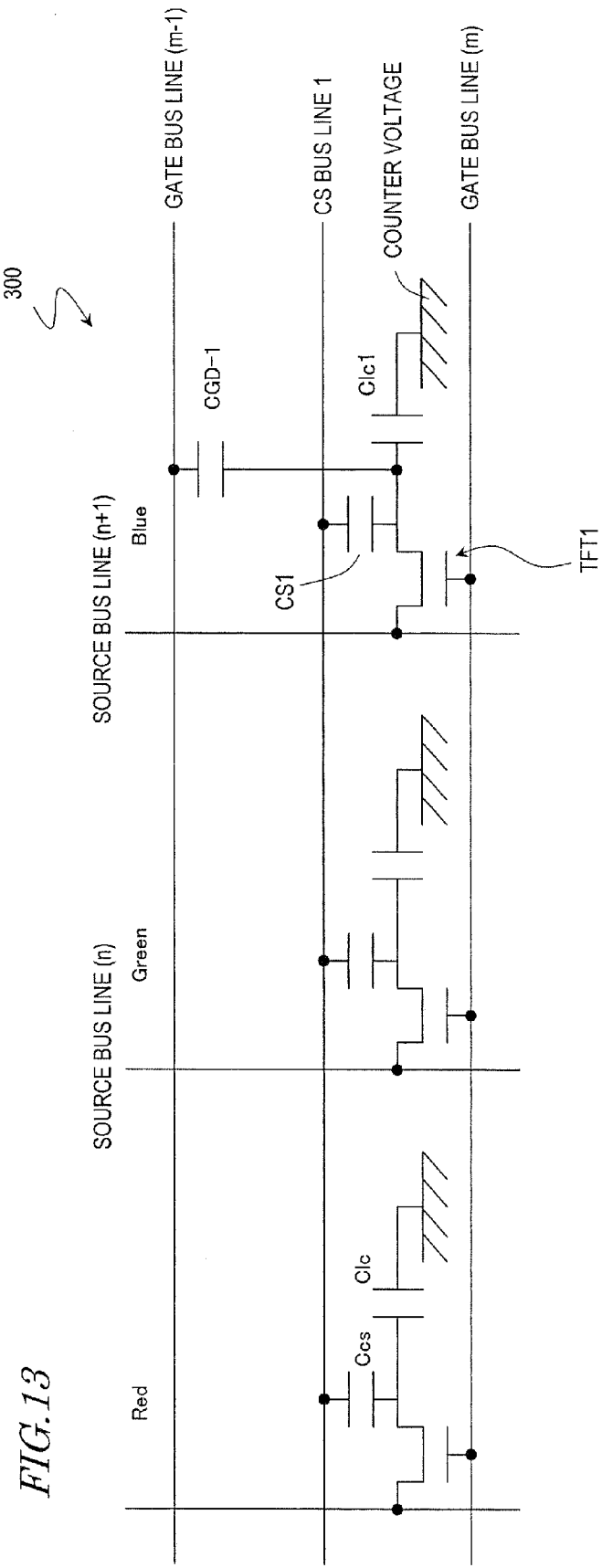

FIG. 13 is an equivalent circuit diagram of one of two sub-picture elements in a liquid crystal display device 300 as still another preferred embodiment of the present invention.

Figure 14:
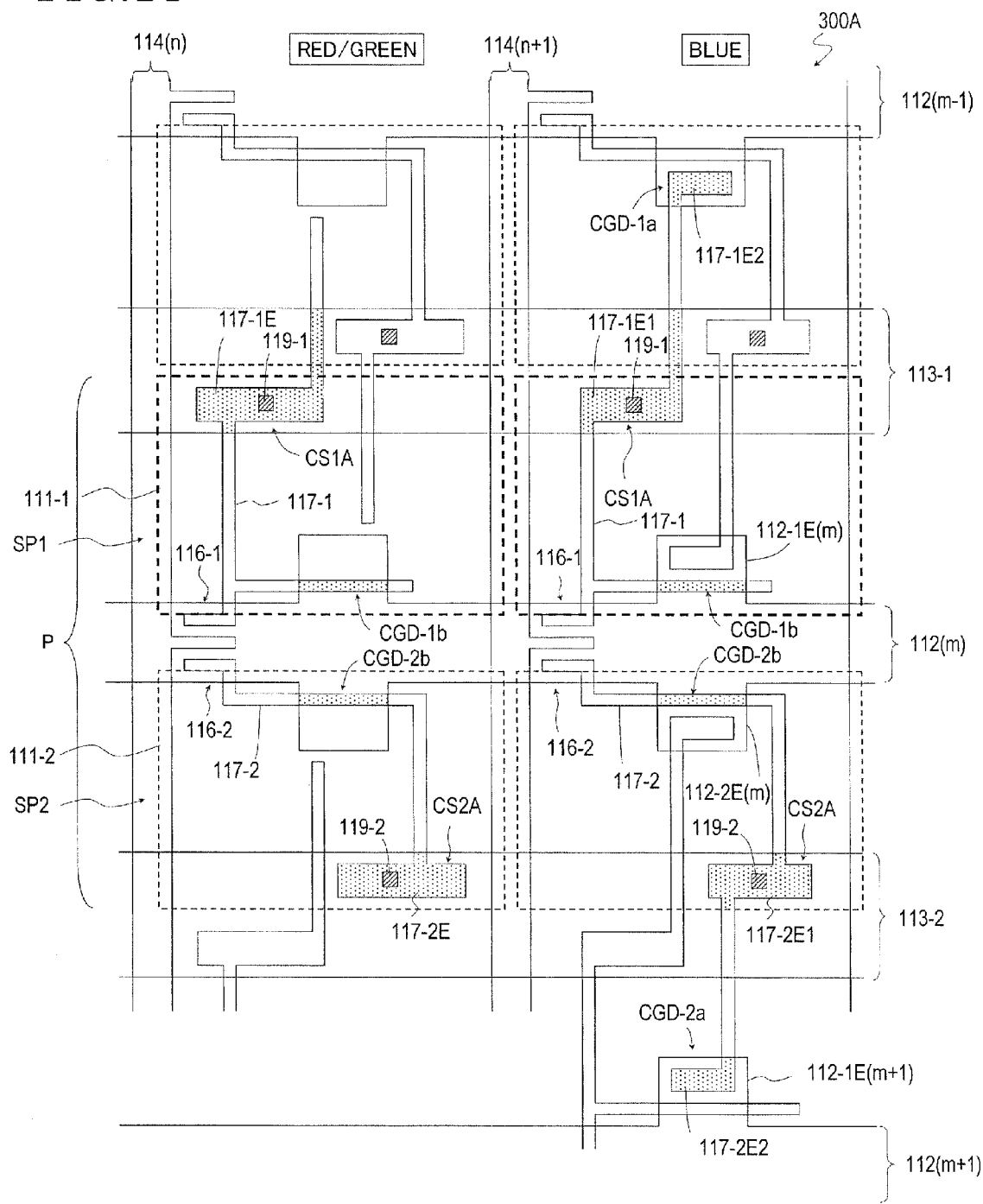

FIG. 14 is a schematic representation illustrating the picture element structure of a liquid crystal display device 300A as yet another preferred embodiment of the present invention.

Figure 15:
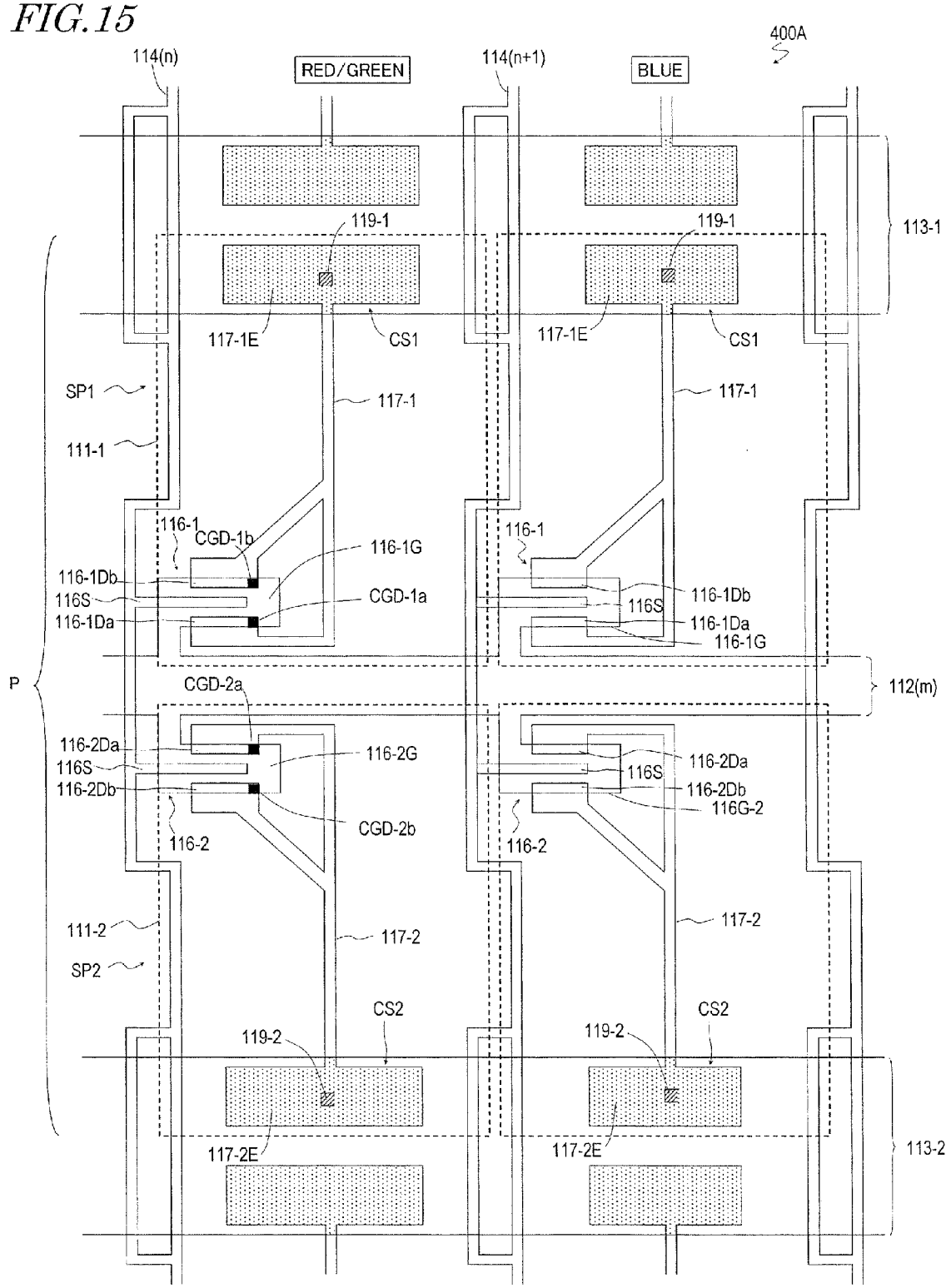

FIG. 15 is a schematic representation illustrating the picture element structure of a liquid crystal display device 400A as yet another preferred embodiment of the present invention.

Figure 16:
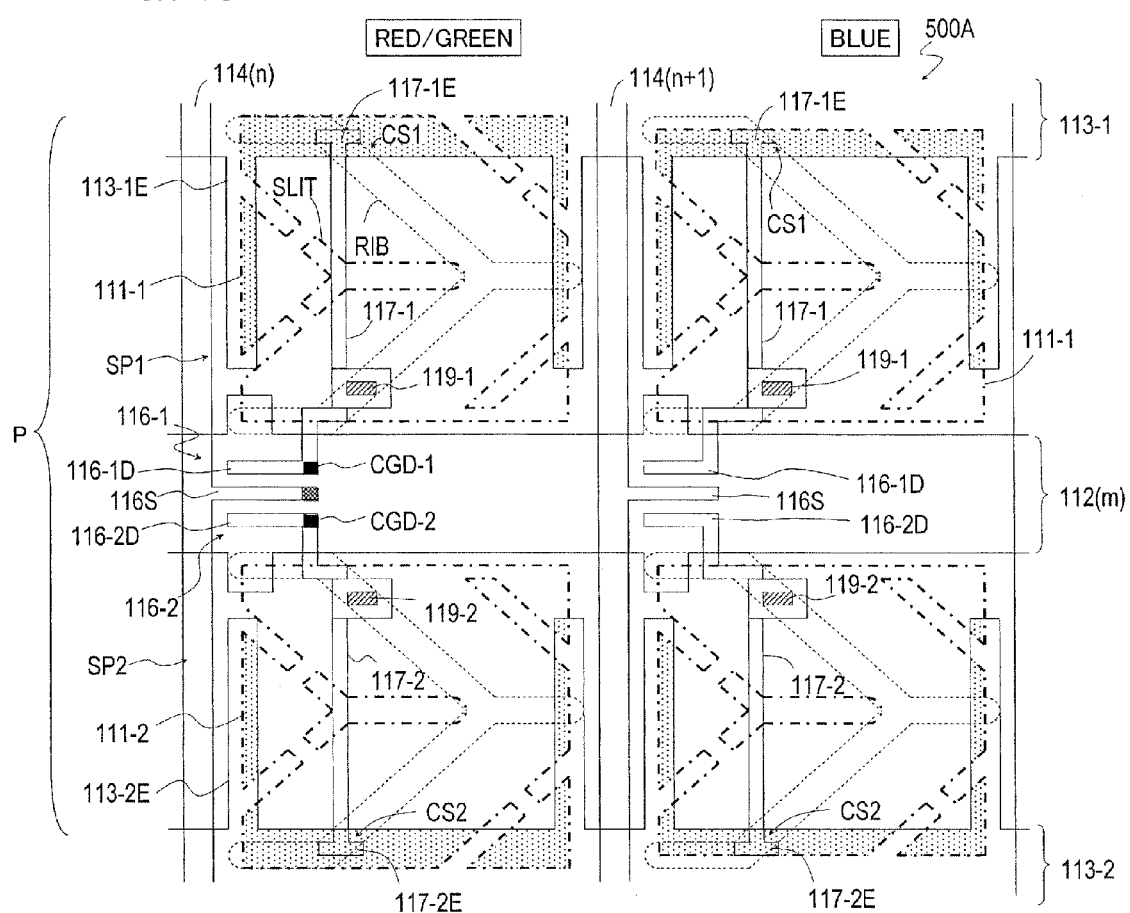

FIG. 16 is a schematic representation illustrating the picture element structure of a liquid crystal display device 500A as yet another preferred embodiment of the present invention.

Figure 17:
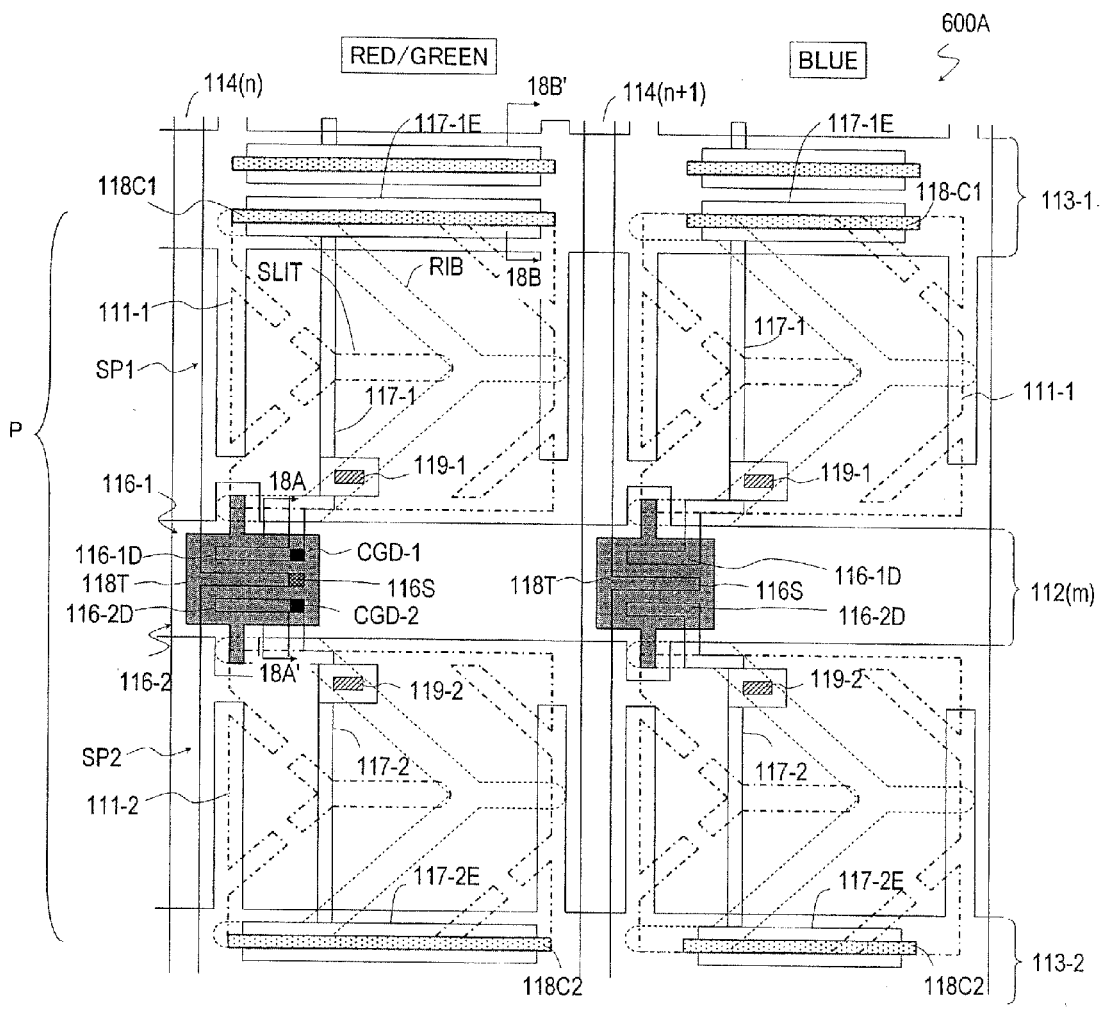

FIG. 17 is a schematic representation illustrating the picture element structure of a liquid crystal display device 600A as yet another preferred embodiment of the present invention.

Figure 18A:
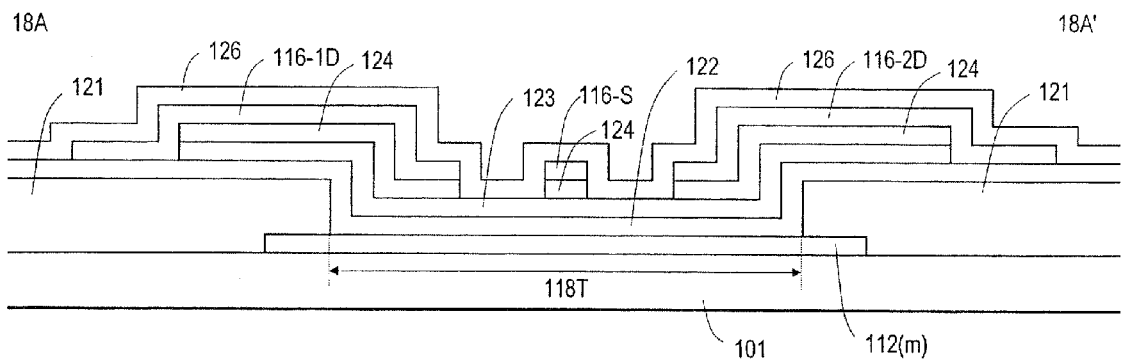

FIG. 18A is a schematic cross-sectional view of the liquid crystal display device 600A as viewed on the plane 18A-18A' shown in FIG. 17.

Figure 18B:
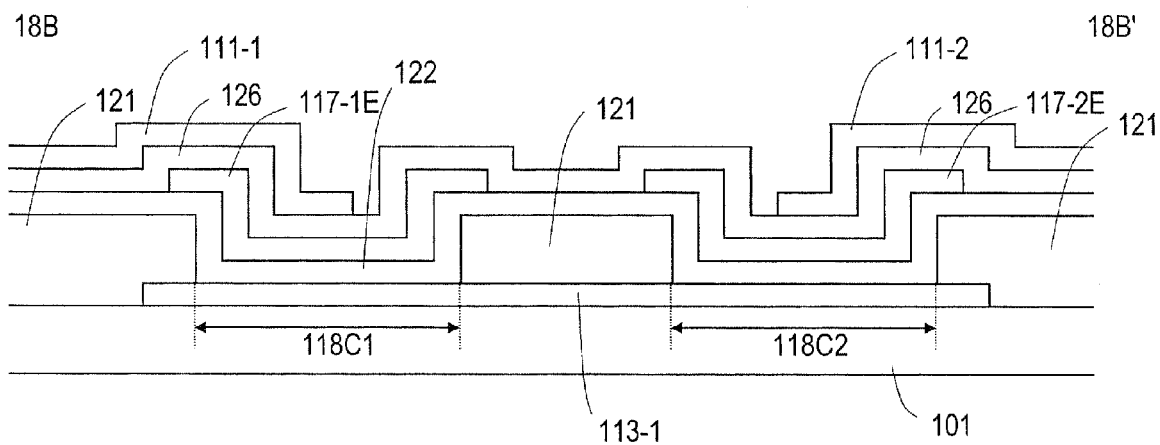

FIG. 18B is a schematic cross-sectional view of the liquid crystal display device 600A as viewed on the plane 18B-18B' shown in FIG. 17.

Figure 18C:
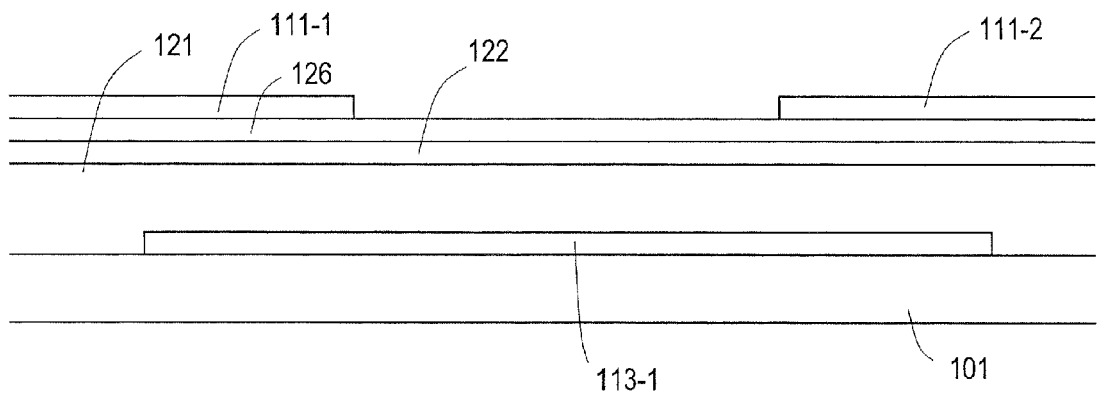

FIG. 18C illustrates, for reference purposes, how the device shown in FIG. 18B looks if the SOG film removed portion is omitted.

Figure 19:
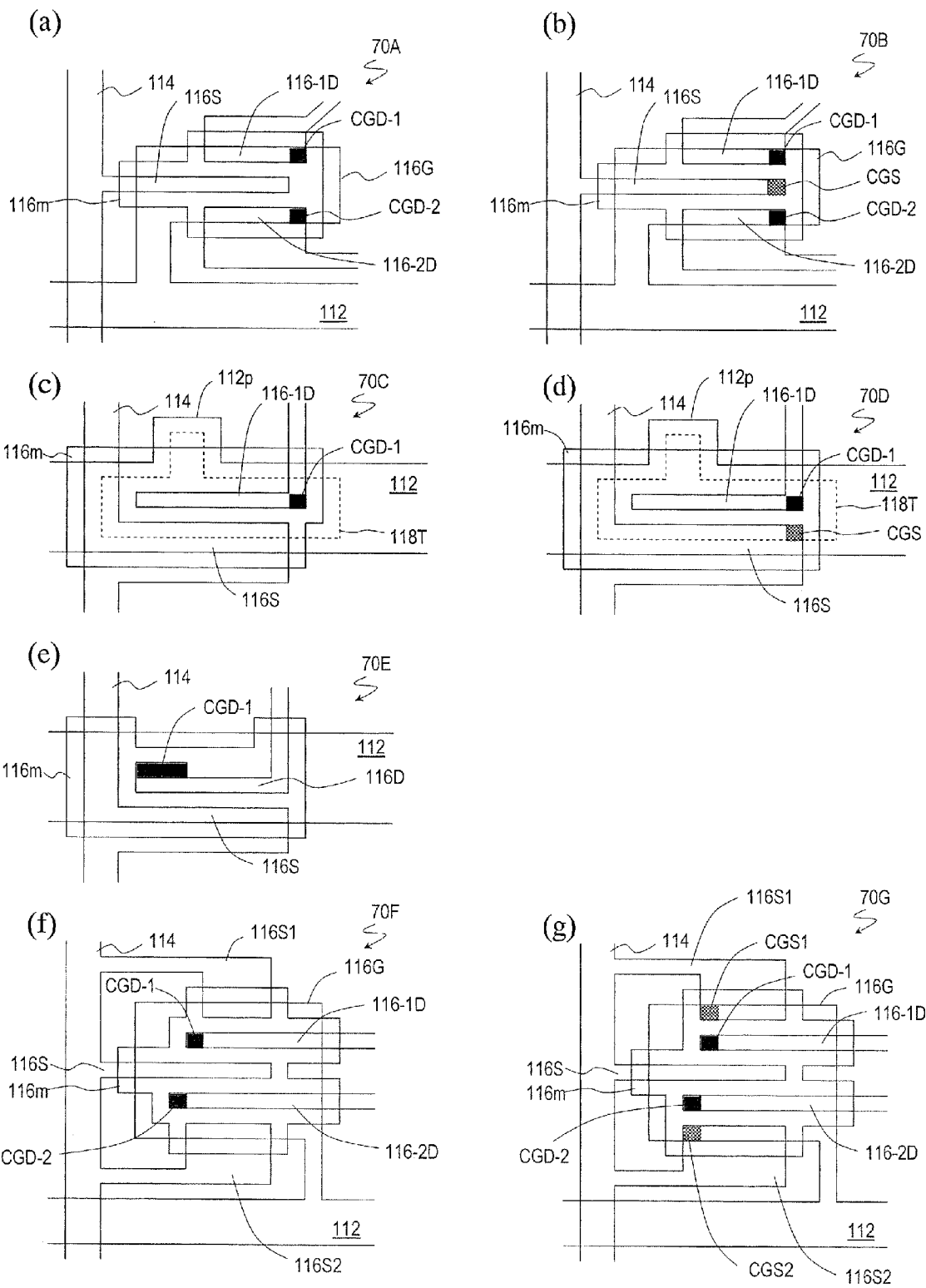

FIGS. 19(*a*) through 19(*g*) are plan views illustrating the structures of alternative TFT sections that may be used in a liquid crystal display device according to any of the preferred embodiments of the present invention described above.

Figure 20:
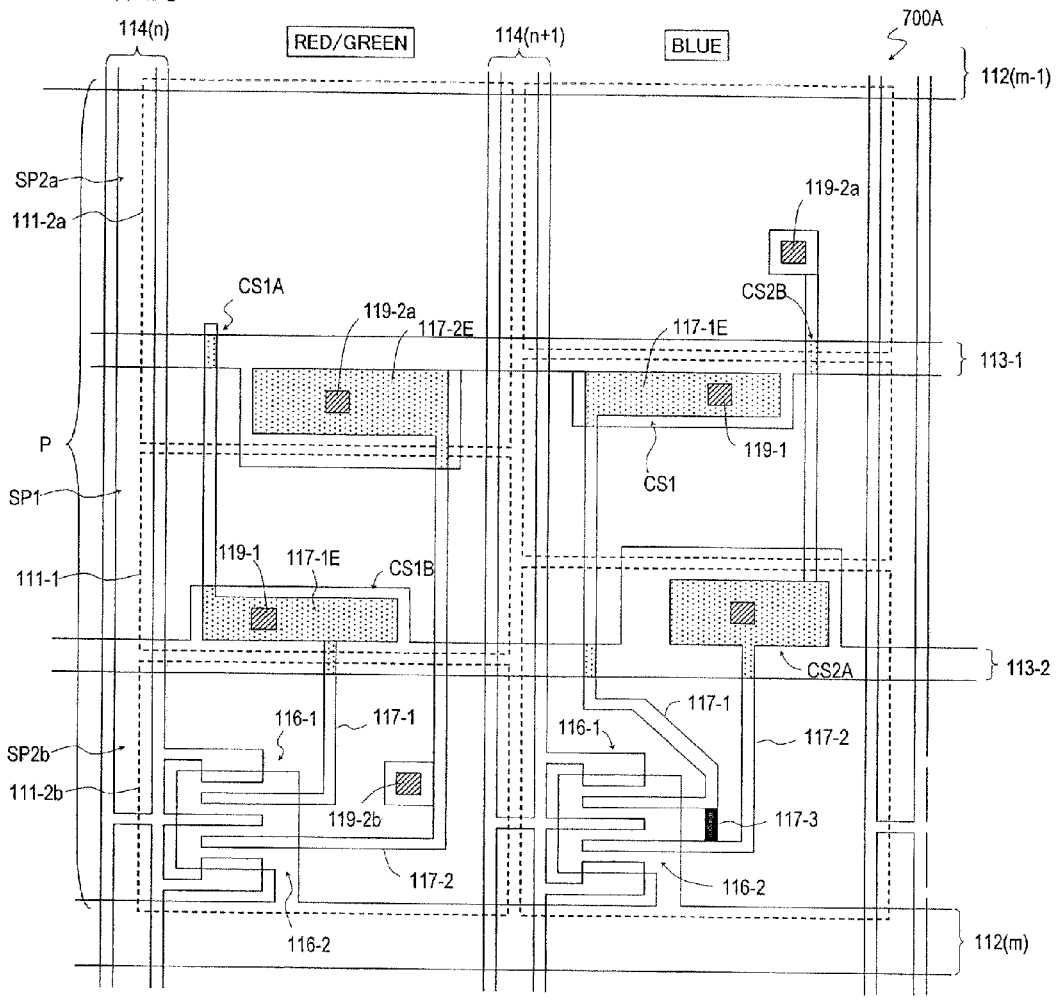

FIG. 20 is a schematic representation illustrating the picture element structure of a liquid crystal display device 700A as yet another preferred embodiment of the present invention.

Figure 21:
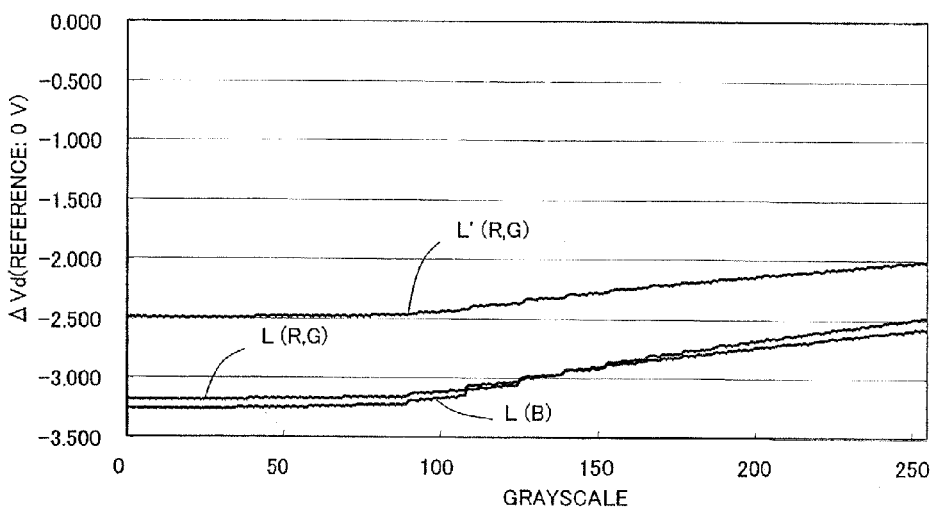

FIG. 21 is a graph showing the grayscale dependences of ΔVd of respective color picture elements in a liquid crystal display device according to a preferred embodiment of the present invention.

DESCRIPTION OF REFERENCE NUMERALS

TFT1, TFT2 thin-film transistor
CS1, CS2 storage capacitor
Clc1, Clc2 liquid crystal capacitor
111-1, 111-2, 111-2*a*, 111-2*b* sub-picture element electrode
112 gate bus line
113 CS bus line
114 source bus line
116-1, 116-2 TFT
117-1, 117-2 drain extension line
119-1, 119-2, 119-2*a*, 119-2*b* contact portion

BEST MODE FOR CARRYING OUT THE INVENTION

Hereinafter, the configuration and operation of a liquid crystal display device as a preferred embodiment of the present invention will be described with reference to the accompanying drawings. In the following description, the present invention is supposed to be implemented as a vertical alignment liquid crystal display device (i.e., a VA mode LCD) that uses a liquid crystal material with negative dielectric anisotropy because significant effects are achieved by the present invention in that case. However, the present invention is in no way limited to that specific preferred embodiment but is also applicable to a TN mode LCD, for example.

Also, in the following description of preferred embodiments, the LCD disclosed in Patent Document No. 2 is cited as a typical VA mode LCD with the multi-picture element structure. However, the present invention does not have to be applied to that type of LCD but may also be applied to any other LCD with the multi-picture element structure.

First of all, it will be described what the present inventors thought are the problems with an LCD having the multi-picture element structure disclosed in Patent Document No. 2.

As described above, when the present inventors fabricated a sample LCD with the multi-picture element structure and analyzed its viewing angle characteristic in detail, the color balance shifted toward the yellow range at around an intermediate grayscale (e.g., around 145/255 grayscale) at an oblique viewing angle.

In the following description, a single picture element is supposed to be divided into two portions with an equal area (one to one division) as shown in FIG. 1 and a result of chromaticity variation in a multi-picture element structure, in which the bright and dark sub-picture elements have an equal area, will be described as an example. FIGS. 2(a) and 2(b) show the chromaticity variations in u' and v' chromaticity coordinates with the grayscales at the frontal viewing angle and at an oblique viewing angle (of which the orientation was nine o'clock direction and the polar angle was 45 degrees), where u' and v' are chromaticity coordinates compliant with the CIE 1976 USC standard.

As can be seen from FIGS. 2(a) and 2(b), u' and v' did not change so much with the grayscale at the frontal viewing angle but increased significantly at around $145^{th}$ grayscale at the oblique viewing angle. As a result, at around the $145^{th}$ grayscale, the image looked more yellowish than at any other grayscale.

As a result of researches, the present inventors understand the reason why the image that should have had an intermediate grayscale became yellowish at the oblique viewing angle as follows. It should be noted that in this example, a single color display pixel is supposed to consist of red, green and blue picture elements (i.e., picture elements in the three primary colors). Naturally, however, the present invention is in no way limited to this example. But even if a single color display pixel consisted of four or more color picture elements (multi-primary color picture elements), the same statement would apply as long as the picture elements include a blue picture element. Also, if a cyan picture element is included along with, or instead of, the blue picture element, the cyan picture element may be treated just as the blue picture element.

FIGS. 3(a) and 3(b) are graphs showing how the transmittances with respect to incoming color light rays in blue, green and red with wavelengths of 450 nm, 550 nm and 650 nm, respectively, changed with the voltage applied to the liquid crystal layer of a normally black mode, VA mode LCD. Specifically, FIGS. 3(a) and 3(b) show the voltage-transmittance characteristics at the frontal viewing angle and at an oblique viewing angle (of which the orientation was nine o'clock direction and the polar angle was 45 degrees), respectively.

A VA mode LCD utilizes the birefringence effect of its liquid crystal layer, of which the retardation has wavelength dispersion property. That is why in a VA mode LCD, the transmittance changes differently according to the wavelength of the incoming light. Also, in the normally black mode, the greater the voltage applied to the liquid crystal layer, the higher the transmittance with respect to each color light ray as can be seen from FIG. 3(a). It can also be seen that the applied voltage that maximized the transmittance to the blue ray was smaller than the applied voltage that maximized the transmittance to any other color ray. And even after the transmittance to the blue ray reached its maximum value, the transmittances to the other color rays increased as the applied voltage was raised. That is why considering normalized transmittances, which are obtained by normalizing the transmittances to the respective color rays with their maximum transmittances, it can be said that only the normalized transmittance to the blue ray decreases once the applied voltage increasing exceeds a certain value. In white display, if the transmittance to the blue ray becomes lower than the transmittance to any other color ray, then the color white will shift toward the yellow range. Also, since the retardation of the liquid crystal layer is apparently larger at an oblique viewing angle than at the frontal viewing angle, the transmittance to the blue ray decreased more significantly at the oblique viewing angle than at the frontal viewing angle as can be seen easily by comparing the results of FIGS. 3(a) and 3(b) to each other. For that reason, at the oblique viewing angle, the image becomes yellowish much more sensibly than at the frontal viewing angle.

Next, look at FIG. 4, which shows the grayscale-transmittance characteristics of a liquid crystal display device with the multi-picture element structure described above at the frontal viewing angle. In FIG. 4, not only the characteristic of the entire picture element but also those of its bright and dark sub-picture elements are shown. Nevertheless, the characteristics of those sub-picture elements are normalized with the transmittance of the entire picture element. In other words, the transmittance of the entire picture element is represented as the sum of the transmittances of the bright and dark sub-picture elements.

As shown in FIG. 4, in a liquid crystal display device with the multi-picture element structure described above, a voltage is applied to the liquid crystal layers of the respective sub-picture elements such that substantially only the bright sub-picture element is lit at low grayscales and that the transmittance of the dark sub-picture element starts to rise at a certain intermediate grayscale.

Figure 5:
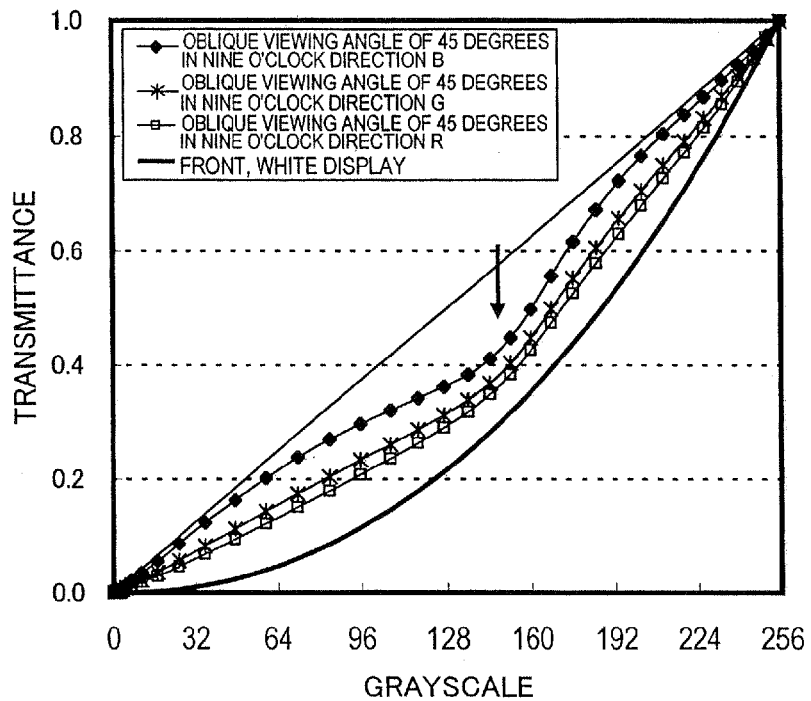
FIG. 5 is a graph showing the grayscale-transmittance characteristics of the three primary colors of red (R), green (G) and blue (B) in a situation where a picture element of a liquid crystal display device with the multi-picture element structure is viewed from an oblique viewing angle (of which the orientation is nine o'clock direction and the polar angle is 45 degrees).

If this picture element is viewed from the oblique viewing angle (of which the orientation is nine o'clock direction and the polar angle is 45 degrees), the grayscale-transmittance characteristics of the three primary colors of red (R), green (G) and blue (B) will be represented by the curves shown in FIG. 5. The intermediate grayscale pointed to by the arrow in FIG. 5 indicates a point at which the transmittance of the bright sub-picture element of a B picture element (which will be simply referred to herein as a "bright sub-picture element B") gets saturated with the increase in grayscale. The transmittance of this bright sub-picture element B gets saturated because the retardation of the liquid crystal layer increases at the oblique viewing angle as described above. In this manner, at the oblique viewing angle, the transmittance of the B picture element decreases at the intermediate grayscale indicated by the arrow unlike the other R and G picture elements and the image (that should look gray) around that intermediate grayscale gets yellowish.

As can be seen easily from the foregoing description, in order to overcome the coloring problem, this phenomenon that the transmittance to the blue ray gets saturated earlier than any other color ray due to the increase in retardation (see FIG. 3(a)) needs to be suppressed. That is to say, to obtain a structure in which the difference between the voltages (which will be identified herein by $\Delta V\alpha$) applied at a certain grayscale to the respective liquid crystal layers of the bright and dark sub-picture elements of a particular picture element is distinct from the voltage difference of the other picture elements, that voltage difference may be the smallest in the blue picture element among multiple color picture elements.

In a liquid crystal display device with the multi-picture element structure of this preferred embodiment, the $\Delta V\alpha$ value of the blue picture element may be made smaller than that of the other color picture elements by setting the storage capacitance value of the blue picture element to be smaller than that of the green and red picture elements. That is to say, among the multiple color picture elements (i.e., primary color picture elements) that form a single color display pixel, the blue picture element may have a smaller storage capacitance value than any other picture element. If a single color display pixel consists of blue, green and red picture elements as in this example, the capacitance values $C_{CS-B}$, $C_{CS-G}$ and $C_{CS-R}$ of the respective storage capacitors of the blue, green and red picture elements need to satisfy the inequality $C_{CS-B} < C_{CS-G} \le C_{CS-R}$. Optionally, if a structure in which $C_{CS-G} = C_{CS-R}$ is adopted, the liquid crystal display device can have a simplified structure. In the example to be described below, the two storage capacitors of the sub-picture elements of a single picture element are supposed to have an equal capacitance value. However, at least one of the storage capacitance values should satisfy the inequality.

Next, it will be described why the saturation of the transmittance to the blue ray is prevented by satisfying the inequality $C_{CS-B} < C_{CS-G} \le C_{CS-R}$.

According to the multi-picture element technique disclosed in Patent Document No. 2 (each picture element of which is represented by the equivalent circuit diagram of FIG. 8 and all picture elements of which have the same capacitance value), a voltage (V+Vm), which is higher by Vm than the voltage V to be applied to the liquid crystal layer of a conventional picture element with no multi-picture element structure, is applied to the liquid crystal layer of one sub-picture element, and a voltage (V−Vm), which is lower than the voltage V by Vm, is applied to the liquid crystal layer of the other sub-picture element, thereby producing bright and dark sub-picture elements.

In this case, supposing Vad is the peak-to-peak amplitude of the oscillating waveform of a storage capacitor voltage (CS voltage) to be applied through a storage capacitor line to a storage capacitor counter electrode, Ccs is the capacitance value of the storage capacitor of each sub-picture element, and Clc is the capacitance value of the liquid crystal capacitor of each sub-picture element, Vm is represented by the following equation:

$$Vm = (½) \cdot Vad \cdot Ccs/(Clc+Ccs)$$

This Vad is twice as high as Vad disclosed in Patent Document No. 2.

Figure 6:
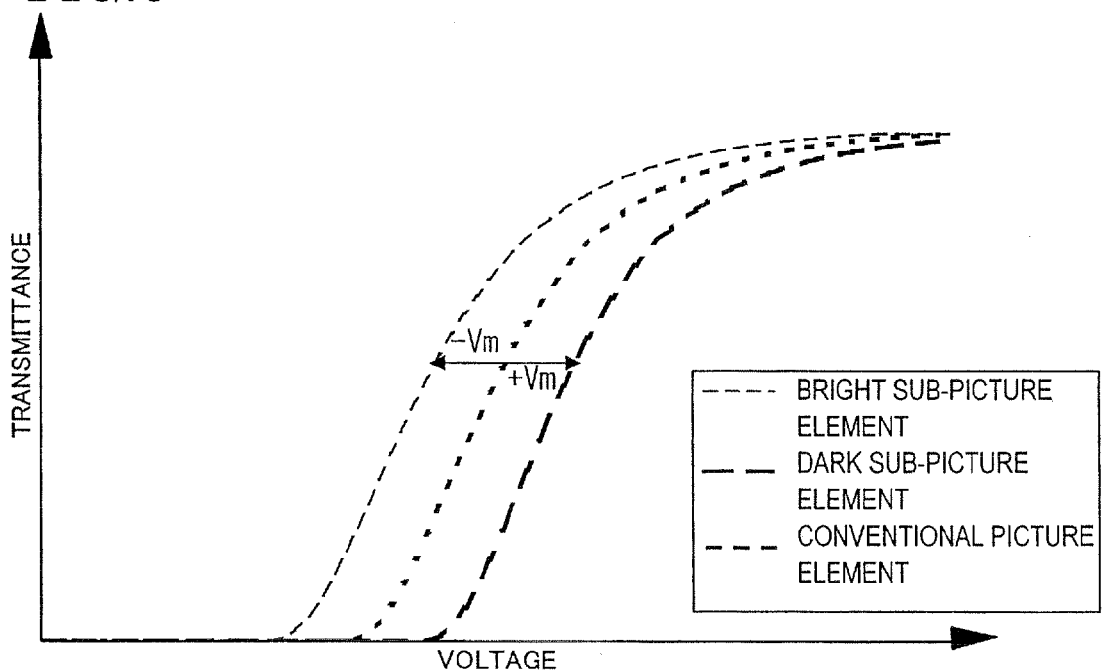
FIG. 6 is a graph showing the voltage-transmittance (V-T) curves of bright and dark sub-picture elements in a liquid crystal display device with the multi-picture element structure.

That is why the voltage-transmittance (V−T) curves of the bright and dark sub-picture elements become as schematically shown in FIG. 6. Specifically, with respect to the V−T curve of a conventional picture element with no multi-picture element structure (as indicated by the central dotted curve), the V−T curve of the bright sub-picture element shifts by Vm toward the lower voltage range and that of the dark sub-picture element shifts by Vm toward the higher voltage range.

For that reason, if the capacitance values of the respective storage capacitors of the blue, green and red picture elements are identified by $C_{CS-B}$, $C_{CS-G}$ and $C_{CS-R}$, respectively, the inequality $C_{CS-B} < C_{CS-G} \le C_{CS-R}$ is preferably satisfied. In that case, Vm of the blue picture element becomes smaller than any other color picture element, and therefore, the saturation and decrease in the transmittance of the bright sub-picture element of the blue picture element can be prevented. As a result, the unwanted phenomenon that the image around the intermediate grayscale gets yellowish at the oblique viewing angle can be suppressed.

It should be noted that if each pixel further includes a cyan picture element, then the inequality $C_{CS-B} \le C_{CS-C} < C_{CS-G} \le C_{CS-R}$ is preferably satisfied, where $C_{CS-C}$ is the capacitance value of the storage capacitor of the cyan picture element. Also, if each pixel includes a cyan picture element with no blue picture element, then the capacitance value $C_{CS-C}$ of the storage capacitor of the cyan picture element needs to be smaller than that of the storage capacitor of any other color picture element (which may be not just a green or red picture element but also a magenta or yellow picture element). In that case, the capacitance values of the storage capacitors of all color picture elements but the cyan picture element may be equal to each other. That is to say, among multiple color picture elements, just the blue or cyan picture element needs to have a smaller storage capacitance value than the other color picture elements (which may be not just red and green picture elements). And if blue and cyan picture elements are both included, settings need to be done so as to satisfy the inequality $C_{CS-B} \le C_{CS-C}$.

Figure 7:
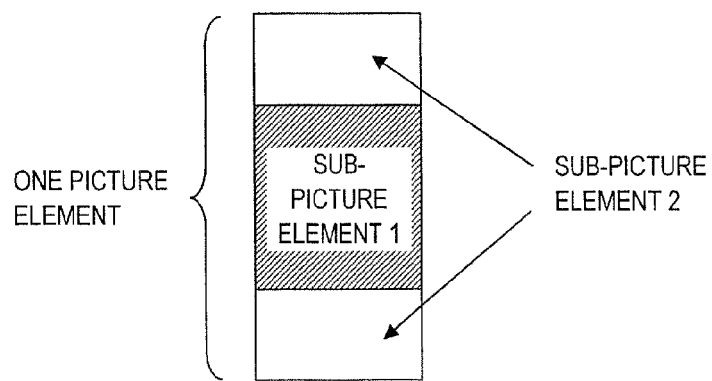
FIG. 7 is a schematic representation illustrating another exemplary multi-picture element structure.

Hereinafter, preferred embodiments of a liquid crystal display device according to the present invention will be described by way of specific examples. In the following example, each picture element is supposed to be equally split into a bright sub-picture element and a dark sub-picture element such that these two sub-picture elements have an equal area. The pattern of the multi-picture element structure of the liquid crystal display device of this preferred embodiment is shown in FIG. 1, but may also be the one shown in FIG. 7. The picture element shown in FIG. 1 includes sub-picture elements #1 and #2 as upper and lower halves of the picture element. On the other hand, the picture element shown in FIG. 7 includes sub-picture element #1 arranged at the center and sub-picture element #2 that has been split into two halves arranged over and under the sub-picture element #1. However, those two halves of the sub-picture element #2 are electrically equivalent to each other and form a single sub-picture element, too. That is why both of the two types of multi-picture element structures shown in FIGS. 1 and 7 are represented by the equivalent circuit shown in FIG. 8. And the liquid crystal display device 100 having the multi-picture element structure represented by the equivalent circuit shown in FIG. 8 is driven with the application of various voltages shown in FIG. 9. As the details are already disclosed in Patent Document No. 2, only the gist will be given below.

A single picture element of the liquid crystal display device 100 shown in FIG. 8 includes sub-picture elements #1 and #2. These sub-picture elements #1 and #2 include liquid crystal capacitors Clc1 and Clc2, respectively, each of which is formed by a liquid crystal layer, a counter electrode to apply a voltage to the liquid crystal layer, and a sub-picture element electrode. A counter electrode is a single electrode that is provided in common for sub-picture elements #1 and #2, and is typically shared by every picture element. A storage capacitor CS1 with a capacitance value Ccs1 and a storage capacitor CS2 with a capacitance value Ccs2 are electrically connected in parallel to the liquid crystal capacitors Clc1 and Clc2, respectively. Each of the storage capacitors CS1 and CS2 is formed by an insulating layer (such as a gate insulating layer) and a storage capacitor counter electrode that faces the storage capacitor electrode with the insulating layer interposed between them. The storage capacitor electrode is connected to the drain electrode of the same TFT as the sub-picture element electrode, while the storage capacitor counter electrode is connected to a storage capacitor line (CS bus line). In this case, CS bus line #1 connected to the storage capacitor of sub-picture element #1 and CS bus line #2 connected to the storage capacitor of sub-picture element #2 are electrically independent of each other. Also, CS bus lines #1 and #2 may be provided for each picture element so as to be electrically independent of the other CS bus lines. Alternatively, as disclosed in Patent Document No. 2, the number of electrically independent CS bus lines may be reduced by combining a number of CS bus lines that supply oscillating voltages with a certain phase relation into a single CS trunk line. In either case, the CS bus line voltages (which are also called "CS voltages" or "storage capacitor counter voltages") to be supplied to the storage capacitors of two or more sub-picture elements in a single picture element have mutually different waveforms.

The sub-picture element electrode of each liquid crystal capacitor Clc1, Clc2 and the storage capacitor electrode of each storage capacitor are connected to the drain electrode of its associated TFT #1 or #2. The respective gate electrodes of the TFTs #1 and #2 are connected in common to the same gate bus line, while the respective source electrodes of the TFTs #1 and #2 are connected in common to the same source bus line.

By supplying the storage capacitor counter voltages to be described later through electrically independent CS bus lines to the storage capacitors of the sub-picture elements with such a relatively simple multi-picture element structure, the effective voltages applied to the liquid crystal capacitors Clc1 and Clc2 of the respective sub-picture elements can be either raised or lowered by Vm.

Portions (a) through (f) of FIG. 9 schematically show the waveforms and timings of respective voltages that are applied to drive the liquid crystal display device with the multi-picture element structure shown in FIG. 8.

Specifically, portion (a) of FIG. 9 shows the voltage waveform Vs of the signal voltage supplied through the source bus line (signal line); portion (b) of FIG. 9 shows the voltage waveform Vcs1 of the storage capacitor voltage supplied through the CS bus line #1; portion (c) of FIG. 9 shows the voltage waveform Vcs2 of the CS bus line #2; portion (d) of FIG. 9 shows the voltage waveform Vg of the gate bus line; portion (e) of FIG. 9 shows the voltage waveform Vlc1 of the sub-picture element electrode of the sub-picture element #1; and portion (f) of FIG. 9 shows the voltage waveform Vlc2 of the sub-picture element electrode of the sub-picture element #2. In FIG. 9, the dashed line indicates the voltage waveform COMMON (Vcom) of the counter electrode.

Hereinafter, it will be described with reference to portions (a) through (f) of FIG. 9 how the equivalent circuit shown in FIG. 8 operates.

First, at a time T1, the voltage Vg rises from VgL (low) to VgH (high) to turn TFT1 and TFT2 ON simultaneously. As a result, the voltage Vs on the source bus line is transmitted to the sub-picture element electrodes of the sub-picture elements #1 and #2 to charge the sub-picture elements #1 and #2 with the voltage Vs. In the same way, the storage capacitors CS1 and CS2 of the respective sub-picture elements are also charged with the voltage on the source bus line. The voltage Vs on the source bus line is a display voltage representing the grayscale to be displayed by that picture element and is written on an associated picture element during a period in which the TFT is ON (and which will be sometimes referred to herein as a "selected period").

Next, at a time T2, the voltage Vg on the gate bus line falls from VgH to VgL to turn TFT1 and TFT2 OFF simultaneously and electrically isolate the sub-picture elements #1 and #2 and the storage capacitors CS1 and CS2 from the source bus line (a period in such a state will sometimes be referred to herein as a "non-selected period"). It should be noted that immediately after the TFTs in ON state have been turned OFF, due to the feedthrough phenomenon caused by a parasitic capacitance of the TFT1 and TFT2, for example, the voltages Vlc1 and Vlc2 applied to the respective sub-picture element electrodes decrease by approximately the same voltage Vd to:

$$Vlc1 = Vs - Vd$$

$$Vlc2 = Vs - Vd$$

respectively. Also, in this case, the voltages Vcs1 and Vcs2 on the CS bus lines are:

$$Vcs1 = Vcom - (\tfrac{1}{2})Vad$$

$$Vcs2 = Vcom + (\tfrac{1}{2})Vad$$

respectively. That is to say, the waveforms of these exemplary voltages Vcs1 and Vcs2 on the CS bus lines are square waves, of which the (full) amplitude is Vad, of which the phases are opposite to each other (i.e., different from each other by 180 degrees) and which have a duty ratio of one to one.

Next, at a time T3, the voltage Vcs1 on the CS bus line #1 connected to the storage capacitor CS1 rises from Vcom−(½)Vad to Vcom+(½)Vad and the voltage Vcs2 on the CS bus line #2 connected to the storage capacitor CS2 falls from Vcom+(½)Vad to Vcom−(½)Vad. That is to say, these voltages Vcs1 and Vcs2 both change by Vad. As the voltages on the CS bus lines #1 and #2 change in this manner, the voltages Vlc1 and Vlc2 applied to the respective sub-picture element electrodes change into:

$$Vlc1 = Vs - Vd + K \times Vad$$

$$Vlc2 = Vs - Vd - K \times Vad$$

respectively, where K=Ccs/(Clc(V)+Ccs).

Next, at a time T4, Vcs1 falls from Vcom+(½)Vad to Vcom−(½)Vad and Vcs2 rises from Vcom−(½)Vad to Vcom+(½)Vad. That is to say, these voltages Vcs1 and Vcs2 both change by Vad again. In this case, Vlc1 and Vlc2 also change from $$Vlc1 = Vs - Vd + K \times Vad$$

$$Vlc2 = Vs - Vd - K \times Vad$$

into $$Vlc1 = Vs - Vd$$

$$Vlc2 = Vs - Vd$$

respectively.

Next, at a time T5, Vcs1 rises from Vcom−(½)Vad to Vcom+(½)Vad and Vcs2 falls from Vcom+(½)Vad to Vcom−(½)Vad. That is to say, these voltages Vcs1 and Vcs2 both change by Vad again. In this case, Vlc1 and Vlc2 also change from $$Vlc1 = Vs - Vd$$

$$Vlc2 = Vs - Vd$$

into $$Vlc1 = Vs - Vd + K \times Vad$$

$$Vlc2 = Vs - Vd - K \times Vad$$

respectively.

After that, every time a period of time that is an integral number of times as long as one horizontal write period 1H has passed, the voltages Vcs1, Vcs2, Vlc1 and Vlc2 alternate their levels at the times T4 and T5. The intervals between the repeated changes at T4 and T5 may be appropriately determined to be one, two, three or more times as long as 1H in view of the method for driving the liquid crystal display device (such as the method of inverting the polarity) and the display status (such as the degree of flicker or roughness of the image on the screen). Such alternate level changes are continued until the picture element is rewritten next time (i.e., until a point in time equivalent to T1 arrives). Consequently, the effective values of the voltages Vlc1 and Vlc2 applied to the sub-picture element electrodes become:

$$Vlc1 = Vs - Vd + K \times (½) Vad$$

$$Vlc2 = Vs - Vd - K \times (½) Vad$$

respectively.

Therefore, the effective voltages V1 and V2 applied to the liquid crystal layers of the sub-picture elements #1 and #2 become:

$$V1 = Vlc1 - Vcom$$

$$V2 = Vlc2 - Vcom$$

That is to say, $$V1 = Vs - Vd + K \times (½) Vad - Vcom$$

$$V2 = Vs - Vd - K \times (½) Vad - Vcom$$

respectively.

As a result, the difference ΔV12 (=V1−V2, which will be sometimes referred to herein as "ΔVα") between the effective voltages applied to the liquid crystal layers of the sub-picture element #1 and #2 becomes $$\Delta V12 = K \times Vad$$

(where K=Ccs/(Clc+Ccs)). It should be noted that the voltage dependence of Clc is not taken into consideration in this example.

Hereinafter, a specific example of a liquid crystal display device according to this preferred embodiment, in which Ccs/Clc is set to be 0.85 and Vad is defined to be 2.5 V, will be described.

Suppose the respective storage capacitors of red, green and blue picture elements have capacitance values $C_{CS-R}$, $C_{CS-G}$, and $C_{CS-B}$, respectively. In this case, $C_{CS-R}=C_{CS-G}$ is supposed to be satisfied and the parameter X representing the ratio of the capacitance value of the storage capacitor of the blue picture element to that of the storage capacitors of the other color picture elements is supposed to be given by $X=C_{CS-B}/C_{CS-G}=C_{CS-B}/C_{CS-R}$.

The variations in the chromaticity represented by u' and v' chromaticity coordinates with the grayscale at the frontal viewing angle and at an oblique viewing angle (of which the orientation was nine o'clock direction and the polar angle was 45 degrees) in a situation where X was set to be 1.00, 0.68, 0.56 or 0.45 are shown in FIGS. 10(a) through 10(d). Specifically, FIGS. 10(a) and 10(b) are graphs showing the grayscale dependences of u' and v' at the frontal viewing angle, while FIGS. 10(c) and 10(d) are graphs showing the grayscale dependences of u' and v' at the oblique viewing angle.

As can be seen from FIGS. 10(a) and 10(b), at the frontal viewing angle, the grayscale dependence remained the same in both u' and v' no matter how much the X value changed. On the other hand, as can be seen from FIGS. 10(c) and 10(d), at the oblique viewing angle, the smaller the X value, the more significantly u' and v' decreased in the vicinity of 140/255 grayscale. Among other things, v' changed particularly steeply and the shift toward the yellow range at the oblique viewing angle could be reduced effectively by decreasing the X value (i.e., X<1). The best X value for the liquid crystal display device of this example would be 0.56 according to the results shown in FIG. 10.

In the liquid crystal display device of this example, the best X value was 0.56. However, if the CS oscillating voltage Vad, the storage capacitance Ccs, and/or the liquid crystal capacitance Clc change(s), then the best X value will also change. That is why the best X value may be defined appropriately in that case. Also, in this example, $C_{CS-G}=C_{CS-R}$ is supposed to be satisfied. However, if $C_{CS-G}<C_{CS-R}$, the color shift caused by the earlier saturation of the green ray than the red ray in the voltage-transmittance curves shown in FIGS. 3(a) and 3(b) can be minimized.

Also, if the multi-picture element structure disclosed in Patent Document No. 2 is adopted, a predetermined effective voltage difference can be produced between sub-picture elements by adjusting the Vad value irrespective of the variation that should occur between respective liquid crystal display devices being manufactured and unlike the multi-picture element structure disclosed in Patent Document No. 4. In the example described above, the amplitudes of the two CS bus line voltages Vcs1 and Vcs2 are both supposed to be Vad. However, those amplitudes may also be defined independently of each other.

In a liquid crystal display device that uses TFTs, the voltage at a sub-picture element electrode should decrease by ΔVd by nature when the gate voltage Vg falls from VgH to VgL as shown in FIG. 9. In this case, the ΔVd value depends on the ratio of the parasitic capacitance Cgd between the gate electrode and drain electrode of a TFT to the sum of the capacitances of all capacitors that are connected to the drain electrode (namely, the liquid crystal capacitor Clc, storage capacitor Ccs and other parasitic capacitors). Normally, Cgd, Clc and Ccs are dominant capacitances and the ΔVd value can be given by ΔVd=Cgd/(Clc+Ccs). That is why if only the Ccs values are simply changed as described above to obtain a desired ΔVα on a color picture element basis, then the ΔVd value should also be different from one color picture element to another. If the ΔVd values are different between respective color picture elements, the average of the voltages to be applied to the respective liquid crystal layers of the color picture elements (i.e., the DC level) will also vary. In that case, in a typical configuration in which a counter electrode is provided in common for all picture elements, the DC voltage components applied to the liquid crystal layers of all picture elements could not be reduced sufficiently even if the counter voltage was regulated. And if the DC voltage components applied to the liquid crystal layers were high, then the display quality or reliability would be affected. That is a problem.

Such a problem could be avoided by providing a counter electrode for each group of color picture elements of the same color and by regulating the counter voltage applied to the counter electrode associated with each group of color picture elements. Naturally, if the electrical configuration of only blue picture elements (and/or cyan picture elements) should be different from that of the other color picture elements, then a first counter electrode associated with a group of blue picture elements (and/or cyan picture elements) and a second counter electrode associated with groups of picture elements of the other colors should be provided and the counter voltages should be regulated so as to compensate for ΔVd for the first and second counter electrodes independently of each other.

If such a measure was taken, however, the counter electrode should be split into at least two sections and respectively predetermined voltages (i.e., counter voltages) should be applied to those two sections of the counter electrode independently of each other, thus complicating the configuration of the liquid crystal display device and increasing its cost.

Thus, to overcome such a problem, a liquid crystal display device that can sufficiently reduce the DC voltage components applied to the liquid crystal layer of every color picture element without complicating the structure too much to avoid that increase in cost will be described as another preferred embodiment of the present invention.

FIG. 11 is an equivalent circuit diagram representing a picture element with a multi-picture element structure of a liquid crystal display device 200 as another preferred embodiment of the present invention. Unlike the picture element shown in FIG. 8, each of the sub-picture elements #1 and #2 of the picture element shown in FIG. 11 has two storage capacitors. The respective storage capacitor counter electrodes of the two storage capacitors of sub-picture element #1 are electrically independent of each other, and those of the two storage capacitors of sub-picture element #2 are also electrically independent of each other.

As shown in FIG. 11, sub-picture element #1 includes storage capacitors CS1A and CS1B and sub-picture element #2 includes storage capacitors CS2A and CS2B. The storage capacitor counter electrodes of the storage capacitors CS1A and CS2B are electrically connected to the same CS bus line #1, the storage capacitor counter electrodes of the storage capacitors CS1B and CS2A are electrically connected to the same CS bus line #2, and those CS bus lines #1 and #2 are electrically independent of each other. In this example, square waves, of which the phases are different from each other by 180 degrees and of which the amplitude is Vad as shown in FIG. 9, are used as the CS voltages.

Suppose the capacitance values of these storage capacitors CS1A, CS1B, CS2A and CS2B are identified by Ccs1A, Ccs1B, Ccs2A and Ccs2B, respectively. In that case, as the CS voltages supplied through the CS bus lines #1 and #2 have mutually opposite phases, the effective storage capacitance value Ccs1α of sub-picture element #1 is given by Ccs1A−Ccs1B and the effective storage capacitance value Ccs2α of sub-picture element #2 is given by Ccs2A−Ccs2B. As a result, by setting Ccs1α or Ccs2α of blue and/or cyan picture element(s) among multiple color picture elements (i.e., primary color picture elements) that form a single color display pixel to be smaller than that of the other color picture elements as described above, the ΔVα value of the blue and/or cyan picture element(s) can be smaller than that of the other color picture elements.

In this case, supposing Ccs1β=Ccs1A+Ccs1B and Ccs2β=Ccs2A+Ccs2B, if the Ccs1β and Ccs2β values remain almost the same in every picture element, then the problem that would be caused if ΔVd is different from one color picture element to another can be avoided. That is to say, by making the Ccs1β and Ccs2β values substantially the same in every picture element, TFTs #1 and #2 of every picture element can have the same design, and therefore, the ΔVd values can also be substantially the same in every picture element. With such a configuration, there is no need to perform the additional process step of patterning the counter electrode or to generate a plurality of counter voltages. And such a configuration is realized just by changing the patterns of a photomask for use in the manufacturing process of TFTs. As a result, the increase in cost can be minimized, too.

As described above, normally, ΔVd is calculated by Cgd/(Clc+Ccs) but (since the dielectric constant of the liquid crystal layer varies as liquid crystal molecules with dielectric anisotropy change their orientations) Clc changes with the voltage applied to the liquid crystal layer. That is why to make ΔVd substantially the same in every picture element and at every grayscale, the ratio of Ccs to Clc (which will be sometimes simply referred to herein as a "Ccs ratio") is preferably substantially constant in every picture element.

On top of that, the liquid crystal display device 200 shown in FIG. 11 can be designed more flexibly than the liquid crystal display device 100 shown in FIG. 8.

In the configuration shown in FIG. 8, the ΔVα value changes proportionally to the Ccs1 value. That is why to reduce the ΔVα value to one-tenth, the Ccs1 value also needs to be reduced to one-tenth in the liquid crystal display device 100 shown in FIG. 8. As the capacitance value of a storage capacitor depends on the area of the electrode, the electrode's area should also be reduced to one-tenth if the Ccs1 value should be reduced to one-tenth. This is not beneficial considering the electrode patterning precision currently available and the eventual production yield. That is to say, the magnitude of the variation in a situation where the ΔVα value of a blue picture element should be reduced in the liquid crystal display device 100 shown in FIG. 8 (i.e., the difference from the ΔVα value of the other color picture elements) would be restricted by the patterning precision or the production yield. In other words, the flexibility of design would decrease. It is naturally possible to increase the ΔVα value of the other color picture elements to relax such a restriction. However, since the ΔVα value is essentially determined from the viewpoint of the viewing angle characteristic, such a measure should not be adopted. On the other hand, in the liquid crystal display device 200 shown in FIG. 11, the ΔVα value is determined based on the difference between the capacitance values of the storage capacitors CS1A and CS1B. That is to say, the ΔVα value does not directly depend on the capacitance values of the storage capacitors CS1A and CS1B themselves, and therefore, is free from the restriction on the patterning precision or production yield. For example, to reduce the ΔVα value of the blue picture element to one-tenth, the color picture elements other than the blue picture element may have capacitance values of 100 pF and 50 pF in their respective storage capacitors CS1A and CS1B (i.e., CS1A−CS1B=50 pF) and the blue picture element may have capacitance values of 55 pF and 50 pF in their respective storage capacitors CS1A and CS1B (i.e., CS1A−CS1B=5 pF). That is to say, the capacitance values of the storage capacitors CS1A and CS1B of the blue picture element can be close to those of the other color picture elements, and the ΔVα value can be set flexibly on a color-by-color basis. Furthermore, as described above, Ccs1β and Ccs2β are more preferably substantially the same in every picture element. Specifically, the blue picture element more preferably satisfies CS1A=77.5 pF and CS1B=72.5 pF, of which the sum is equal to the sum of the capacitance values of the storage capacitors CS1A and CS1B (=150 pF) in every picture element.

The liquid crystal display device 200 shown in FIG. 11 can be used to not only minimize the shift in color balance at an oblique viewing angle as described above but also increase the precision of setting the ΔVα value as well.

The ΔVα value depends on the product of the capacitance value of a storage capacitor and the amplitude of the CS voltage supplied from an external circuit. In the liquid crystal display device 100 shown in FIG. 8, to increase the precision of setting the storage capacitance value, the storage capacitance value needs to be a relatively large value. In that case, the CS voltage supplied from an external circuit will have decreased amplitude and the precision of setting the amplitude of the CS voltage will decrease. Conversely, to increase the precision of setting the amplitude of the CS voltage by increasing the amplitude of the CS voltage supplied from the external circuit, the storage capacitance value should be reduced to a smaller value, and therefore, the precision of setting the storage capacitance value will decrease. In contrast, with the configuration shown in FIG. 11, the storage capacitance value can be set to be a relatively large value with the amplitude of the voltage supplied from an external circuit kept sufficient large. As a result, the precision of setting the $\Delta V\alpha$ value can be increased.

Furthermore, by electrically connecting the storage capacitor counter electrodes of the storage capacitors CS1A and CS2B to the same CS bus line #1 and the storage capacitor counter electrodes of the storage capacitors CS1B and CS2A to the same CS bus line #2 (which is electrically independent of CS bus line #1), respectively, as shown in FIG. 11, the number of electrically independent CS bus lines can be cut down, which is also beneficial.

FIG. 12 illustrates a picture element structure for a liquid crystal display device 200A as a preferred embodiment of the present invention. The equivalent circuit of the liquid crystal display device 200A is the same as that of the liquid crystal display device 200 shown in FIG. 11. In FIG. 12, illustrated schematically are the structure of two picture elements that are located at the intersection between the $m^{th}$ row and $n^{th}$ column and at the intersection between the $m^{th}$ row and $(n+1)^{th}$ column on the TFT substrate, among multiple picture elements that are arranged in column and rows. The picture element at the intersection between the $m^{th}$ row and $n^{th}$ column is either a red picture element or a green picture element, while the picture element at the intersection between the $m^{th}$ row and $(n+1)^{th}$ column is a blue picture element. In the following description, any pair of components shown in multiple drawings and having substantially the same function will be identified by the same reference numeral. And once a component has been described, the description of its counterpart will be omitted herein to avoid redundancies.

In this liquid crystal display device 200A, each picture element P includes a first sub-picture element SP1 and a second sub-picture element SP2a and SP2b, of which the liquid crystal layers can be supplied with mutually different voltages, and at a certain grayscale, the first sub-picture element has a higher luminance than the second sub-picture element. The second sub-picture element includes second sub-picture element portions SP2a and SP2b, which are arranged so as to interpose the first sub-picture element SP1 between them. That is to say, this liquid crystal display device 200A has the multi-picture element structure shown in FIG. 7. However, the area of the second sub-picture element (i.e., the combined area of the second sub-picture element portions SP2a and SP2b) is approximately three times as large as that of the first sub-picture element SP1. In this case, the second sub-picture element portions SP2a and SP2b are located spatially apart from each other, but are electrically equivalent to each other, have the same voltage applied to their liquid crystal layers, and also exhibit the same electro-optical characteristic (i.e., V-T characteristic). That is why from the viewpoint of V-T characteristic, these second sub-picture element portions SP2a and SP2b form a single sub-picture element (i.e., the second sub-picture element). That is to say, the picture element P exhibits two different types of V-T characteristics and can also be regarded as having a structure in which a single picture element has been split into first and second sub-picture elements SP1 and SP2. In the following description, these second sub-picture element portions SP2a and SP2b will be collectively referred to herein as the "second sub-picture element SP2" for the sake of simplicity.

As shown in FIG. 12, the first sub-picture element SP1 is arranged in the area defined by a first sub-picture element electrode 111-1, while the second sub-picture element portions SP2a and SP2b are arranged in the areas defined by second sub-picture element electrode halves 111-2a and 111-2b.

Now look at the picture element P located at the intersection between the $m^{th}$ row and $n^{th}$ column (which will be simply referred to herein as an (m, n) picture element). The (m, n) picture element is driven by TFTs 116-1 and 116-2 that are connected to a gate bus line 112(m) and a source bus line 114(n). The drain of the TFT 116-1 is connected to the first sub-picture element electrode 111-1 at a contact portion 119-1 by way of a drain extension line 117-1. On the other hand, the drain of the TFT 116-2 is connected to the second sub-picture element electrode half 111-2a at a contact portion 119-2a by way of a drain extension line 117-2 and is also connected to the second sub-picture element electrode half 111-2b at a contact portion 119-2b by way of the drain extension line 117-2. The sub-picture element electrodes 111-1, 111-2a and 111-2b, along with the liquid crystal layer (not shown) and the counter electrode (not shown, either) opposed to the electrodes through the liquid crystal layer, form liquid crystal capacitors. Specifically, the sub-picture element electrode 111-1 forms Clc1 shown in FIG. 11 and the sub-picture element electrodes 111-2a and 111-2b form Clc2 shown in FIG. 11.

In this example, the source bus line 114(n) includes two main lines that run in the column direction and a bridge portion that connects those two main lines together. One of the two main lines of the source bus line 114(n) overlaps with the sub-picture element electrodes 111-1, 111-2a and 111-2b on the $n^{th}$ column, while the other main line overlaps with the sub-picture element electrodes on the $(n-1)^{th}$ column. In this case, to reduce the parasitic capacitance Csd between the source bus line 114(n) and the sub-picture element electrodes sufficiently, an interlayer dielectric film of a resin is provided between them. In other words, by providing such an interlayer dielectric film, the sub-picture element electrodes can be arranged so as to overlap with the source bus line 114(n) and the aperture ratio of the pixel can be increased as a result.

The TFTs 116-1 and 116-2 have a bottom-gate structure and each include: a gate electrode, which is provided as an extended portion of the gate bus line 112(m); a semiconductor layer (not shown), which is arranged over the gate electrode; and source/drain electrodes, which are arranged in the source region of the semiconductor layer. The source electrode is provided as an extended portion of the source bus line 114(n). The drain electrodes of the TFTs 116-1 and 116-2 form an integral part of the drain extension lines 117-1 and 117-2, respectively. Furthermore, the interlayer dielectric film is provided so as to cover all of these members. And the sub-picture element electrodes 111-1, 111-2a and 111-2b are arranged on the interlayer dielectric film. At the contact portions 119-1, 119-2a and 119-2b that are arranged to fill the contact holes that have been cut through the interlayer dielectric film, the drain extension lines 117-1 and 117-2 are connected to the sub-picture element electrodes 111-1, 111-2a and 111-2b.

Next, the configuration of the storage capacitors of the (m, n) picture element will be described. In this example, the (m, n) picture element may be either a red picture element or a green picture element.

Through the picture elements on the $m^{th}$ row, two CS bus lines (i.e., storage capacitor lines) 113-1 and 113-2 run. The CS bus lines 113-1 and 113-2 respectively correspond to CS bus lines #1 and #2 shown in FIG. 11.

The sub-picture element SP1 includes two storage capacitors CS1A and CS1B. The storage capacitor CS1A is arranged at an intersection between the drain extension line 117-1 and the CS bus line 113-1. On the other hand, the storage capacitor CS1B is arranged in an area where an extended portion 117-1E of the drain extension line 117-1 and a broadened portion of the CS bus line 113-1 overlap with each other. Both of the CS bus lines 113-1 and 113-2 are made of the same conductive layer as the gate bus line 112(*m*) and are covered with the gate insulating film (not shown). The dielectric layers of the storage capacitors CS1A and CS1B are both gate insulating films and the capacitance values thereof are both proportional to the areas of the electrodes. In this example, the capacitance value of the storage capacitor CS1A is smaller than that of the storage capacitor CS1B as shown in FIG. 12.

The sub-picture element SP2 includes two storage capacitors CS2A and CS2B. The storage capacitor CS2A is arranged at an intersection between the drain extension line 117-2 and the CS bus line 113-2. On the other hand, the storage capacitor CS2B is arranged in an area where an extended portion 117-2E of the drain extension line 117-2 and a broadened portion of the CS bus line 113-1 overlap with each other. The dielectric layers of the storage capacitors CS2A and CS2B are both gate insulating films and the capacitance values thereof are both proportional to the areas of the electrodes. In this example, the capacitance value of the storage capacitor CS2A is smaller than that of the storage capacitor CS2B as shown in FIG. 12.

Next, the configuration of the storage capacitors of the (m, n+1) picture element (i.e., a blue picture element) will be described.

The sub-picture element SP1 of the blue picture element includes two storage capacitors CS1A and CS1B. The storage capacitor CS1A is arranged in an area where a first extended portion 117-1E1 of the drain extension line 117-1 and a broadened portion of the CS bus line 113-1 overlap with each other. On the other hand, the storage capacitor CS1B is arranged in an area where a second extended portion 117-1E2 of the drain extension line 117-1 and a broadened portion of the CS bus line 113-2 overlap with each other and at an intersection between the drain extension line 117-1 and the CS bus line 113-2. In this example, the capacitance value of the storage capacitor CS1A is larger than that of the storage capacitor CS1B as shown in FIG. 12.

The sub-picture element SP2 of the blue picture element includes two storage capacitors CS2A and CS2B. The storage capacitor CS2A is arranged in an area where an extended portion 117-2E1 of the drain extension line 117-2 and a broadened portion of the CS bus line 113-2 overlap with each other. On the other hand, the storage capacitor CS2B is arranged in an area where a second extended portion 117-2E2 of the drain extension line 117-2 and a broadened portion of the CS bus line 113-1 overlap with each other and at an intersection between the drain extension line 117-2 and the CS bus line 113-1. In this example, the capacitance value of the storage capacitor CS2A is larger than that of the storage capacitor CS2B as shown in FIG. 12.

In this manner, the connectivity between the storage capacitors CS1A and CS1B and their associated CS bus lines and the magnitudes of the capacitance values of the storage capacitors CS1A and CS1B in the (m, n) picture element turn over in the (m, n+1) picture element. This arrangement is adopted to cope with a drive mode in which the polarities of write voltages (i.e., the polarities of the voltages supplied through the source bus line 114 with reference to the counter voltage (that is called a "display signal voltage")) invert between the (m, n) and (m, n+1) picture elements. Such a drive mode is sometimes called a "dot inversion drive".

In each of the (m, n) and (m, n+1) picture elements, the storage capacitor counter electrodes of the storage capacitors CS1A and CS2B are electrically connected to the same CS bus line 113-1, while the storage capacitor counter electrodes of the storage capacitors CS1B and CS2A are electrically connected to the same CS bus line 113-2. Suppose the square waves, of which the phases are different from each other by 180 degrees and which have amplitude Vad as shown in FIG. 9, are supplied as the CS voltages through the CS bus lines 113-1 and 113-2 as in the example described above and the capacitance values of the storage capacitors CS1A, CS1B, CS2A and CS2B are identified by Ccs1A, Ccs1B, Ccs2A and Ccs2B, respectively. In that case, since the phases of the CS voltages supplied through the CS bus lines 113-1 and 113-2 are opposite to each other, the effective storage capacitance value Ccs1α for the sub-picture element SP1 becomes Ccs1A−Ccs1B and the effective storage capacitance value Ccs2α for the sub-picture element SP2 becomes Ccs2A−Ccs2B. That is why as already described with reference to FIG. 11, by setting the Ccs1α or Ccs2α value of the blue picture element among multiple color picture elements that form a single color display pixel (i.e., picture elements in the three primary colors of R, G and B in this example) to be smaller than that of the other color picture elements, the ΔVα value of the blue picture element can be smaller than that of the other color picture elements. In the example illustrated in FIG. 12, by increasing the capacitance values of the blue picture element, i.e., Ccs1B and Ccs2B of the (m, n+1) picture element, Ccs1α and Ccs2α are decreased.

In this case, supposing Ccs1β=Ccs1A+Ccs1B and Ccs2β=Ccs2A+Ccs2B, the Ccs1β and Ccs2β values remain almost the same in every picture element as shown in FIG. 12. That is why the problem that would occur if ΔVd were different from one color picture element to another can be avoided. Specifically, both of the (m, n) and (m, n+1) picture elements have the same Ccs1β and Ccs2β values.

Furthermore, in the example illustrated in FIG. 12, the ratio of the capacitance of the liquid crystal capacitor Clc1 to the storage capacitance Ccsβ1 in the sub-picture element SP1 and the ratio of the capacitance of the liquid crystal capacitor Clc2 to the storage capacitance Ccsβ2 in the sub-picture element SP2 are substantially equal to each other. Since the liquid crystal layers of the sub-picture elements SP1 and SP2 have the same thickness, the liquid crystal capacitance of each sub-picture element is proportional to the area of its associated sub-picture element electrode. And since the area of the sub-picture element SP2 is roughly three times as large as that of the sub-picture element SP1, the liquid crystal capacitance of the sub-picture element SP2 will also be approximately three times as large as that of the sub-picture element SP1. That is why by setting the capacitance value Ccs2β of the storage capacitor of the sub-picture element SP2 to be approximately three times as large as the capacitance value Ccsβ1 of the storage capacitor of the sub-picture element SP1, the ratio of the capacitance value of the liquid crystal capacitor Clc1 to the storage capacitance Ccsβ1 in the sub-picture element SP1 is made approximately equal to the ratio of the capacitance value of the liquid crystal capacitor Clc2 to the storage capacitance Ccsβ2 in the sub-picture element SP2.

Furthermore, in the example illustrated in FIG. 12, the drain extension lines 117-1 and 117-2 and the drain extension lines' extended portions 117-1E, 117-2E, 117-1E1, 117-1E2, 117-2E1 and 117-2E2 are arranged such that the blue picture element (i.e., (m, n+1) picture element in this example) and the other picture elements (i.e., (m, n) picture element in this example) have apertures (i.e., openings to pass the incoming light) of the same shape. By making the shapes of the apertures of all picture elements substantially the same in this manner, the uniformity of display can be increased.

Hereinafter, a liquid crystal display device as still another preferred embodiment of the present invention will be described with reference to FIGS. 13 and 14.

FIG. 13 is an equivalent circuit diagram of one of the two sub-picture elements of a single picture element in a liquid crystal display device 300 having a dual picture element structure.

As already described with reference to FIG. 8, if the capacitance value of the storage capacitor of the blue picture element is reduced such that the blue picture element has the smallest $\Delta V\alpha$ value, then the blue picture element will have different $\Delta Vd$ from the other color picture elements. Thus, in this liquid crystal display device 300, to compensate for the decrease in the capacitance value of the storage capacitor of the blue picture element, a gate-drain capacitor CGD-1 is formed using the gate bus line on an adjacent row. In this example, as to a blue picture element belonging to the $m^{th}$ row, CGD-1 is formed with the gate bus line on the $(m-1)^{th}$ row. However, the present invention is in no way limited to this specific example. Alternatively, CGD-1 may also be formed using the gate bus line on the $(m+1)^{th}$ row. If such a compensating gate-drain capacitor CGD-1 (of which the capacitance value is identified by $C_{CGD-1}$) is formed with a gate bus line at an OFF-state potential in this manner, then $\Delta Vd=Cgd/(Clc+Ccs+C_{CGD-1})$ will be satisfied. Thus, by regulating $C_{CGD-1}$ (i.e., by ironing out the difference in capacitance value between the storage capacitor of the blue picture element and those of the other color picture elements), every color picture element can have the same $\Delta Vd$ value.

FIG. 14 illustrates a picture element structure for a liquid crystal display device 300A as a preferred embodiment of the present invention. The equivalent circuit of the liquid crystal display device 300A is the same as that of the liquid crystal display device 300 shown in FIG. 13. In FIG. 14, illustrated schematically are the structure of two picture elements that are located at the intersection between the $m^{th}$ row and $n^{th}$ column and at the intersection between the $m^{th}$ row and $(n+1)^{th}$ column on the TFT substrate, among multiple picture elements that are arranged in column and rows. The picture element at the intersection between the $m^{th}$ row and $n^{th}$ column is either a red picture element or a green picture element, while the picture element at the intersection between the $m^{th}$ row and $(n+1)^{th}$ column is a blue picture element. In this liquid crystal display device 300A, each picture element P includes a first sub-picture element SP1 and a second sub-picture element SP2. That is to say, this liquid crystal display device 300A has the multi-picture element structure shown in FIG. 1 and the ratio in the area of the first sub-picture element SP1 to the second sub-picture element SP2 is one to one.

Unlike the liquid crystal display device 200A shown in FIG. 12, each sub-picture element of the liquid crystal display device 300A has only one storage capacitor. Specifically, the sub-picture element SP1 includes only a storage capacitor CS1A between the CS bus line 113-1 and the extended portion 117-1E of the drain extension line 117-1 but has no storage capacitors with the CS bus line 113-2. On the other hand, the sub-picture element SP2 includes only a storage capacitor CS2A between the CS bus line 113-2 and the extended portion 117-2E of the drain extension line 117-2 but has no storage capacitors with the CS bus line 113-1. In this respect, the liquid crystal display device 300A has a simpler configuration than the liquid crystal display device 200A.

In the liquid crystal display device 300A, by setting the capacitance values (or the areas) of the storage capacitors CS1A and CS2A of the blue picture element (i.e., the (m, n+1) picture element) to be smaller than those of the storage capacitors CS1A and CS2A of the other color picture element (i.e., the (m, n) picture element) as described above, the $\Delta V\alpha$ value of the blue picture element can be smaller than that of the other color picture element.

Look at the blue picture element (i.e., the (m, n+1) picture element) now. The drain extension line 117-1 includes a first extended portion 117-1E1 that forms the storage capacitor CS1A of the sub-picture element SP1 and a second extended portion 117-1E2 that overlaps with a gate bus line 112($m$−1). A compensating gate-drain capacitor CGD-1$a$ is formed in an area where the second extended portion 117-1E2 overlaps with the gate bus line 112($m$−1). On the other hand, the drain extension line 117-2 includes a first extended portion 117-2E1 that forms the storage capacitor CS2A of the sub-picture element SP2 and a second extended portion 117-2E2 that overlaps with a gate bus line 112($m$+1). A compensating gate-drain capacitor CGD-2$a$ is formed in an area where the second extended portion 117-2E2 overlaps with the gate bus line 112($m$+1).

Comparing the blue picture element (i.e., the (m, n+1) picture element) to the other picture element (i.e., the (m, n) picture element), it can be seen that the capacitance value (or the area shown in FIG. 14) of the storage capacitor CS1A is greater in the (m, n) picture element than in the (m, n+1) picture element. It can also be seen that the compensating gate-drain capacitors CGD-1$a$ and CGD-2$a$ are provided only for the (m, n+1) picture element. That is to say, the compensating gate-drain capacitors CGD-1$a$ and CGD-2$a$ are provided to compensate for the deficit in the capacitance value of the storage capacitor CS1A of the (m, n+1) picture element with the (m, n) picture element.

It should be noted that both of the (m, n) and (m, n+1) picture elements have the gate-drain capacitors CGD-1$b$ and CGD-2$b$. These are capacitors formed between the extended portion of the gate bus line (m) to drive the (m, n) picture element and the drain extension line 117-1 or 117-2. That is why their capacitance value is included in Cgd in the numerator of the equation that defines $\Delta Vd$ and these capacitors are provided to adjust the Cgd value.

Thus, by adopting the configuration of the liquid crystal display device 300A, the $\Delta Vd$ values can be equalized in every color picture element with a simpler configuration than that of the liquid crystal display device 200A.

Furthermore, in the example illustrated in FIG. 14, the drain extension lines 117-1 and 117-2 and the extended portion of the gate bus line 112($m$) are arranged such that the blue picture element (i.e., (m, n+1) picture element in this example) and the other picture element (i.e., (m, n) picture element in this example) have apertures (i.e., openings to pass the incoming light) of substantially the same shape. By making the shapes of the apertures of all picture elements substantially the same in this manner, the uniformity of display can be increased. Just like the liquid crystal display device 200A, the liquid crystal display device 300A also has a structure in which the aperture ratio of a pixel is increased by making the sub-picture element electrodes 111-1 and 111-2 overlap with the source bus line 114($n$) with an interlevel dielectric film interposed between them.

FIG. 15 illustrates a picture element structure for a liquid crystal display device 400A as another preferred embodiment of the present invention. The equivalent circuit of the liquid crystal display device 400A is the same as that of the liquid crystal display device 100 shown in FIG. 8. In FIG. 15, illustrated schematically are the structure of two picture elements that are located at the intersection between the $m^{th}$ row and $n^{th}$ column and at the intersection between the $m^{th}$ row and $(n+1)^{th}$ column on the TFT substrate, among multiple picture elements that are arranged in column and rows. The picture element at the intersection between the $m^{th}$ row and $n^{th}$ column is either a red picture element or a green picture element, while the picture element at the intersection between the $m^{th}$ row and $(n+1)^{th}$ column is a blue picture element. In this liquid crystal display device 400A, each picture element P includes a first sub-picture element SP1 and a second sub-picture element SP2. That is to say, this liquid crystal display device 400A has the multi-picture element structure shown in FIG. 1 and the ratio in the area of the first sub-picture element SP1 to the second sub-picture element SP2 is one to one.

In the liquid crystal display device 400A, by setting the capacitance values (or the areas) of the storage capacitors CS1 and CS2 of the blue picture element (i.e., the (m, n+1) picture element) to be smaller than those of the storage capacitors CS1 and CS2 of the other color picture element (i.e., the (m, n) picture element), the Δvα value of the blue picture element can be smaller than that of the other color picture element.

ΔVd can be regulated by adjusting Cgd (i.e., the numerator of the equation that gives ΔVd) of the TFT.

As shown in FIG. 15, in the TFT 116-1, the areas of overlap of the drain electrodes 116-1Da and 116-1Db with the gate electrode 116-1G are greater in the (m, n) picture element than in the (in, n+1) picture element. In the same way, in the TFT 116-2, the areas of overlap of the drain electrodes 116-2Da and 116-2Db with the gate electrode 116-2G are greater in the (m, n) picture element than in the (m, n+1) picture element. That is why the Cgd capacitance value of the TFT 166-1 of the (m, n) picture element is greater than that of the TFT 166-1 of the (m, n+1) picture element by those extra areas of overlap of the drain electrodes (corresponding to CGD-1a and CGD-1b) with the gate electrode. In the same way, the Cgd capacitance value of the TFT 166-2 of the (m, n) picture element is greater than that of the TFT 166-2 of the (m, n+1) picture element by those extra areas of overlap of the drain electrodes (corresponding to CGD-2a and CGD-2b) with the gate electrode. And by ironing out such a difference in Cgd capacitance value, the difference in the capacitance value of the storage capacitor can be compensated for.

By adopting such a configuration, every picture element will have the same structure except the TFT section thereof, and therefore, every picture element will have an aperture of the same shape and a high degree of uniformity of display will be achieved. Just like the liquid crystal display devices 200A and 300A described above, the liquid crystal display device 400A also has a structure in which the aperture ratio of a pixel is increased by making the sub-picture element electrodes 111-1 and 111-2 overlap with the source bus line 114(n) with an interlevel dielectric film interposed between them.

FIG. 16 illustrates a picture element structure for a liquid crystal display device 500A as another preferred embodiment of the present invention. The equivalent circuit of the liquid crystal display device 500A is the same as that of the liquid crystal display device 100 shown in FIG. 8. In FIG. 16, illustrated schematically are not only the structure of two picture elements that are located at the intersection between the $m^{th}$ row and $n^{th}$ column and at the intersection between the $m^{th}$ row and $(n+1)^{th}$ column on the TFT substrate, among multiple picture elements that are arranged in column and rows, but also the arrangement of ribs on the counter substrate. The picture element at the intersection between the $m^{th}$ row and $n^{th}$ column is either a red picture element or a green picture element, while the picture element at the intersection between the $m^{th}$ row and $(n+1)^{th}$ column is a blue picture element. In this liquid crystal display device 500A, each picture element P includes a first sub-picture element SP1 and a second sub-picture element SP2. That is to say, this liquid crystal display device 500A has the multi-picture element structure shown in FIG. 1 and the ratio in the area of the first sub-picture element SP1 to the second sub-picture element SP2 is one to one.

The liquid crystal display device 500A is an MVA mode LCD, in which each of the sub-picture element electrodes 111-1 and 111-2 has slits as shown in FIG. 16 and in which liquid crystal molecules are aligned in a predetermined direction by an oblique electric field generated near the slits and an anchoring force produced by the ribs that have been formed on the surface of the counter substrate in contact with the liquid crystal layer. Specifically, those slits and ribs are arranged so as to form four liquid crystal domains, where liquid crystal molecules have four tilt angles that are different from each other by 90 degrees upon the application of a voltage, in each of the sub-picture elements SP1 and SP2. Although the slits and ribs do not have to be aligned in such a pattern, each sub-picture element preferably has four liquid crystal domains to improve the viewing angle characteristic.

In the liquid crystal display device 500A, by setting the areas of the sub-picture element electrodes 111-1 and 111-2 of the blue picture element (i.e., the (m, n+1) picture element) to be smaller than those of the sub-picture element electrodes 111-1 and 111-2 of the other color picture element (i.e., the (m, n) picture element), the capacitance values of the liquid crystal capacitors Clc1 and Clc1 and the storage capacitors Ccs1 and Ccs2 (see FIG. 8) of the blue picture element can be smaller than those of the other color picture element.

This is a structure to be adopted in a situation where the interlevel dielectric film is relatively thin. In this structure, the sub-picture element electrodes 111-1 and 111-2 are arranged so as not to overlap with the source bus line 114(n). Also, most of the storage capacitors CS1 and CS2 is defined by providing extended portions 113-1E and 113-2E, which run parallel to the source bus line 114(n), for the CS bus lines 113-1 and 113-2 and by making the CS bus lines 113-1 and 113-2, including parts of the extended portions 113-1E and 113-2E, overlap with the sub-picture element electrodes 111-1 and 111-2 with an interlevel dielectric film (not shown) interposed between them. In this example, each of the CS bus lines 113-1 and 113-2 includes a pair of extended portions 113-1E, 113-2E that overlaps with both edges of its associated sub-picture element electrode 111-1 or 111-2. However, the present invention is in no way limited to this specific preferred embodiment. Also, the thickness of the interlevel dielectric film may be appropriately adjusted according to its dielectric constant and area. It should be noted that overlapping portions between the extended portions 117-1E and 117-2E of the drain extension lines 117-1 and 117-2 and the CS bus lines 113-1 and 113-2 also contribute to forming the storage capacitors.

In the liquid crystal display device 200A, etc. described above, only the capacitance value of the storage capacitor CS is adjusted to make the ΔVα value of the blue picture element different from the others. In this liquid crystal display device 500A, however, the capacitance values of the liquid crystal capacitor Clc and the storage capacitor CS are adjusted. If the area of the sub-picture element electrode is reduced, the capacitance values of the liquid crystal capacitor Clc and storage capacitor CS will both decrease. But as the capacitance value of the storage capacitor CS decreases significantly, the $\Delta V\alpha$ value can be reduced eventually.

In the liquid crystal display device 500A, $\Delta Vd$ is regulated by adjusting Cgd (i.e., the numerator of the equation that gives $\Delta Vd$) of the TFT, as in the liquid crystal display device 400A described above. As shown in FIG. 16, in this liquid crystal display device 500A, the areas of the drain electrodes 116-1D and 116-2D of the TFTs 116-1 and 116-2 are increased in the (m, n) picture element compared to the (m, n+1) picture element, and the areas of the source electrodes 116S are increased, too. By adopting such a configuration, the Cgd capacitance value of the (m, n) picture element can be increased and the channel width of the TFT can also be increased effectively.

FIG. 17 illustrates a picture element structure for a liquid crystal display device 600A as another preferred embodiment of the present invention. The equivalent circuit of the liquid crystal display device 600A is the same as that of the liquid crystal display device 100 shown in FIG. 8. In FIG. 17, illustrated schematically are not only the structure of two picture elements that are located at the intersection between the $m^{th}$ row and $n^{th}$ column and at the intersection between the $m^{th}$ row and $(n+1)^{th}$ column on the TFT substrate, among multiple picture elements that are arranged in column and rows, but also the arrangement of ribs on the counter substrate. FIG. 18A is a cross-sectional view of the device as viewed on the plane 18A-18A' shown in FIG. 17, and FIG. 18B is a cross-sectional view of the device as viewed on the plane 18B-18B' shown in FIG. 17.

The liquid crystal display device 600A is an MVA mode LCD having the same alignment division structure as the liquid crystal display device 500A. The picture element at the intersection between the $m^{th}$ row and $n^{th}$ column is either a red picture element or a green picture element, while the picture element at the intersection between the $m^{th}$ row and $(n+1)^{th}$ column is a blue picture element. In this liquid crystal display device 600A, each picture element P includes a first sub-picture element SP1 and a second sub-picture element SP2. That is to say, this liquid crystal display device 600A has the multi-picture element structure shown in FIG. 1 and the ratio in the area of the first sub-picture element SP1 to the second sub-picture element SP2 is one to one.

Just like the liquid crystal display device 500A, the liquid crystal display device 600A also includes a relatively thin interlevel dielectric film 126 between the source bus line 114(n) and the sub-picture element electrodes 111-1 and 111-2 (see FIGS. 18A and 18B). That is why the sub-picture element electrodes 111-1 and 111-2 are arranged so as not to overlap with the source bus line 114(n). Furthermore, the liquid crystal display device 600A includes not just the gate insulating film 122 of the liquid crystal display device 200A and other devices described above but also a spin-on-glass (SOG) film 121 on the gate insulating film 122. As the material of the SOG film, a spin-on-glass material including an organic component (i.e., a so-called "organic SOG material") is preferably used. Among other things, a SOG material with a Si—O—C bond as its skeleton or a SOG material with a Si—C bond as its skeleton can be used particularly effectively. As used herein, the SOG material is a material that can form a glass film (i.e., a silica-based coating) by a spin coating or any other suitable coating process.

The SOG film 121 is relatively thick. For that reason, if the SOG film 121 were interposed between the semiconductor layer 123 of the TFT (see FIG. 18A) and the gate electrode 112(m), then the TFT would not operate normally. To avoid such a situation, the SOG film 121 is not provided in a region of the TFT 116-1 or 116-2 where the gate insulating film 122 should function as such. In FIGS. 17 and 18A, that region is shown as a SOG film removed region 118T.

Also, the SOG film 121 has a relatively low dielectric constant of four or less, for example. That is why if the SOG film 121 is arranged between the electrodes, then the capacitance value of the capacitor to be formed will be small. For example, in the arrangement shown in FIG. 18C, the SOG film 121 is interposed between the CS bus line 113-1 and the sub-picture element electrodes 111-1 and 111-2. That is why the capacitor to be formed between those electrodes will have a small capacitance value and will contribute a little to forming a storage capacitor.

In the liquid crystal display device 600A, the SOG film removed regions 118C1 and 118C2 are defined between the drain extension line extended portions 117-E1 and 117-E2 and the CS bus lines 113-1 and 113-2 as shown in FIGS. 17 and 18B, thereby forming storage capacitors. Specifically, a storage capacitor CS1 is formed in the SOG film removed region 118C1 and a storage capacitor CS2 is formed in the SOG film removed region 118C2.

In the liquid crystal display device 600A, by setting the capacitance values of the storage capacitors CS1 and CS2 of the blue picture element (i.e., the (m, n+1) picture element) to be smaller than those of the storage capacitors CS1 and CS2 of the other color picture element (i.e., the (m, n) picture element), the $\Delta V\alpha$ value of the blue picture element can be smaller than that of the other color picture element.

$\Delta Vd$ is regulated by adjusting Cgd (i.e., the numerator of the equation that gives $\Delta Vd$) of the TFT, as in the liquid crystal display devices 400A and 500A described above. Also, as in the liquid crystal display device 500A, the areas of the drain electrodes 116-1D and 116-2D of the TFTs 116-1 and 116-2 are increased in the (m, n) picture element compared to the (m, n+1) picture element, and the areas of the source electrodes 116S are increased, too. By adopting such a configuration, the Cgd capacitance value of the (m, n) picture element can be increased and the channel width of the TFT can also be increased effectively.

The method of regulating $\Delta Vd$ by adjusting Cgd may be modified in various manners. According to the TFT configuration, any appropriate one may be selected from those various methods, or if necessary, two or more methods may be combined, too. Some of those modified methods of adjusting Cgd of a TFT are shown in FIGS. 19(a) through 19(g).

First, in the TFT section 70A shown in FIG. 19(a), Cgd of a color picture element other than a blue picture element is increased by extending the drain electrodes 116-1D and 116-2D.

On the other hand, in the TFT section 70B shown in FIG. 19(b), Cgd of a color picture element other than the blue picture element is increased and the channel width of the TFT is increased effectively by extending the drain electrodes 116-1D and 116-2D and the source electrode 116S.

These methods can be carried out just as described above. Other options are available as shown in FIGS. 19(c) through 19(g).

Specifically, in the TFT section 70C shown in FIG. 19(c), Cgd of the color picture element other than the blue picture element is increased by extending the drain electrode 116-1D. And by extending the drain electrode in the direction in which the gate bus line runs, the decrease in aperture ratio is minimized.

On the other hand, in the TFT section 70D shown in FIG. 19(d), not just Cgd of the color picture element other than the blue picture element but also the channel width of the TFT are increased effectively by extending the source electrode 116S, as well as the drain electrode 116-1D. And by extending the channel width of the TFT in the direction in which the gate bus line runs, the decrease in aperture ratio is minimized.

Furthermore, in the TFT section 70E shown in FIG. 19(e), CGD-1 is formed with the tip of the drain electrode 116D extended, thereby increasing not only Cgd of the color picture element other than the blue picture element but also the vertical channel width of the TFT. Since the shape of the source electrode 116S is not changed, the load on the source bus line 114 hardly increases.

Meanwhile, in the TFT section 70F shown in FIG. 19(f), not just Cgd of the color picture element other than the blue picture element but also the channel width of the TFT are increased effectively by extending the drain electrodes 116-1D and 116-2D. Since the shape of the source electrode 116S is not changed, the load on the source bus line 114 hardly increases.

Furthermore, in the TFT section 70G shown in FIG. 19(g), not just Cgd of the color picture element other than the blue picture element but also the channel width of the TFT are increased even more effectively than in the TFT section 70F by extending the source electrodes 116S1 and 116S2, as well as the drain electrodes 116-1D and 116-2D.

Optionally, the configuration of the liquid crystal display device 700A shown in FIG. 20 may also be adopted.

The liquid crystal display device 700A basically has the same configuration as the liquid crystal display device 200A shown in FIG. 12. In the liquid crystal display device 200A, two storage capacitors are provided for each sub-picture element (e.g., the storage capacitors CS1A and CS1B are provided for the sub-picture element SP1) and their capacitance values are changed between the blue picture element and the other color picture element, thereby making their ΔVα different from each other. On the other hand, in the liquid crystal display device 700A, each sub-picture element also includes two storage capacitors (e.g., the storage capacitors CS1A and CS1B are provided for the sub-picture element SP1) but the capacitance values of these storage capacitors are the same in every color picture element. In the liquid crystal display device 700A, the drain extension line 117-1 for the first sub-picture element SP1 of the blue picture element (i.e., the (m, n+1) picture element) and the drain extension line 117-2 for the second sub-picture element SP2 thereof are short-circuited together with a drain short-circuit line 117-3, thereby reducing ΔVα of the blue picture element to substantially zero. That is to say, since only the blue picture element does not have the multi-picture element structure, the viewing angle dependence of the blue grayscale characteristic will deteriorate but problems that would otherwise be caused by coloring or a variation in ΔVd will never happen.

Any of these configurations that have been described with reference to FIGS. 12 through 19, but the one shown in FIG. 20, may be used either by itself or in any arbitrary combination with another one or other ones.

FIG. 21 shows the grayscale dependences of ΔVd of respective color picture elements in a liquid crystal display device as a preferred embodiment of the present invention. The graph shown in FIG. 21 shows ΔVd of the respective color picture elements in a situation where the ratio X of the capacitance value of the storage capacitor of the blue picture element to that of the storage capacitor of the other color picture elements is optimized to be 0.56 in order to minimize the shift toward the yellow range at an oblique viewing angle in the liquid crystal display device that has already been described with reference to FIG. 10. Specifically, the curve L(B) shows ΔVd of the blue picture element, the curve L'(R, G) shows ΔVd of the other color picture elements, of which the difference in storage capacitance value is not compensated for, and the curve L(R, G) shows ΔVd of the other color picture elements that has been substantially equalized with that of the blue picture element by adjusting Cgd.

As can be seen clearly from FIG. 21, if X=0.56 and if the difference in storage capacitance is not compensated for at all, then the difference in ΔVd between the blue picture element and the other color picture elements exceeds 0.5 V (=500 mV). The present inventors discovered and confirmed via experiments that when the difference in ΔVd exceeded 150 mV, a flicker was produced and the reliability decreased. If the difference in ΔVd exceeds 50 mV, then sometimes a degradation may be recognized in display quality. That is why to avoid the problems to be caused by the ΔVd difference in actual products, ΔVd should be reduced to 50 mV or less in at least one grayscale. In this description, if ΔVd is substantially the same, it means that the difference in ΔVd is equal to or smaller than 50 mV. It can be seen that in the example illustrated in FIG. 21, the difference between the curve L(B) and the curve L(R, G) at the $140^{th}$ grayscale is as small as 4 mV.

A multi-picture element structure in which each picture element is split into two sub-picture elements has been described as a preferred embodiment of the present invention. However, the present invention is in no way limited to that specific preferred embodiment. Alternatively, each picture element may also be divided into three or more sub-picture elements as well.

INDUSTRIAL APPLICABILITY

A liquid crystal display device according to the present invention can be used effectively in liquid crystal TVs and other applications that require excellent viewing angle characteristics.

The invention claimed is:

1. A liquid crystal display device comprising:
a plurality of picture elements that are arranged in columns and rows so as to form a matrix pattern, each said picture element including a liquid crystal layer and a plurality of electrodes for applying a voltage to the liquid crystal layer,
wherein each said picture element includes a first sub-picture element and a second sub-picture element having the ability to apply mutually different voltages to their liquid crystal layer, wherein at a grayscale level, the first sub-picture element has a higher luminance than the second sub-picture element,
gate bus lines;
source bus lines;
wherein each of the first and second sub-picture elements includes a liquid crystal capacitor formed by a counter electrode and a sub-picture element electrode that faces the counter electrode through the liquid crystal layer, and at least one storage capacitor, each being formed by a storage capacitor electrode that is electrically connected to the sub-picture element electrode, an insulating layer, and a storage capacitor counter electrode that is opposed to the storage capacitor electrode with the insulating layer interposed between them,
a plurality of TFTs, wherein each of the first and second sub-picture elements includes a TFT that is connected to the sub-picture element electrode thereof;
wherein after a display voltage representing a certain grayscale level has been applied to the respective sub-picture element electrodes of the first and second sub-picture elements, a voltage difference $\Delta V\alpha$ is produced between voltages to be applied to the respective liquid crystal capacitors of the first and second sub-picture elements by way of their associated storage capacitor(s), wherein in some of the picture elements, the voltage difference $\Delta V\alpha$ changes from one picture element to another, wherein the at least one storage capacitor includes two storage capacitors, wherein the counter electrode is a single electrode that is provided in common for the first and second sub-picture elements, wherein the storage capacitor counter electrodes of the two storage capacitors of the first sub-picture element are electrically independent of each other, and the storage capacitor counter electrodes of the two storage capacitors of the second sub-picture element are also electrically independent of each other; and wherein the first and second capacitor counter electrodes of the two storage capacitors of the first sub-picture element are electrically independent from the gate bus lines, and the first and second capacitor counter electrodes of the two storage capacitors of the second sub-picture element are electrically independent from the gate bus lines.

2. The liquid crystal display device of claim 1, wherein if the two storage capacitors of the first sub-picture element are identified by CS1A and CS1B and if the two storage capacitors of the second sub-picture element are identified by CS2A and CS2B, the storage capacitor counter electrodes of the storage capacitors CS1A and CS2B are electrically connected to the same first storage capacitor line, the storage capacitor counter electrodes of the storage capacitors CS1B and CS2A are electrically connected to the same second storage capacitor line, and the first and second storage capacitor lines are electrically independent of each other.

3. The liquid crystal display device of claim 2, wherein if the capacitance values of the storage capacitors CS1A, CS1B, CS2A and CS2B are identified by Ccs1A, Ccs1B, Ccs2A and Ccs2B, respectively, and if Ccs1$\alpha$=Ccs1A−Ccs1B and Ccs2$\alpha$=Ccs2A−Ccs2B, some of the picture elements have different Ccs1$\alpha$ or Ccs2$\alpha$.

4. The liquid crystal display device of claim 3, wherein the picture elements include a plurality of color picture elements that represent mutually different colors and that include a blue picture element and/or a cyan picture element, and wherein among those color picture elements, the Ccs1$\alpha$ and Ccs2$\alpha$ values of the blue and/or cyan picture element(s) are the smallest.

5. The liquid crystal display device of claim 3, wherein if Ccs1$\beta$=Ccs1A+Ccs1B and Ccs2$\beta$=Ccs2A+Ccs2B, the Ccs1$\beta$ and Ccs2$\beta$ values remain the same in every picture element.

6. The liquid crystal display device of claim 1, wherein the picture elements include a plurality of color picture elements that represent mutually different colors and that include a blue picture element and/or a cyan picture element, and wherein among those color picture elements, the $\Delta V\alpha$ value of the blue and/or cyan picture element(s) is the smallest.

* * * * *